United States Patent
Lee et al.

(10) Patent No.: US 10,784,030 B2
(45) Date of Patent: Sep. 22, 2020

(54) MAGNETIC SHEET, MODULE COMPRISING SAME, AND PORTABLE DEVICE COMPRISING SAME

(71) Applicant: Amogreentech Co. Ltd., Gimpo-si, Gyeonggi-do (KR)

(72) Inventors: Jin Hyoung Lee, Boryeong-si (KR); Hyun Tae Joo, Incheon (KR); Chol Han Kim, Incheon (KR)

(73) Assignee: AMOGREENTECH CO., LTD., Gyeonggi-do (KR)

( * ) Notice: Subject to any disclaimer, the term of this patent is extended or adjusted under 35 U.S.C. 154(b) by 73 days.

(21) Appl. No.: 15/766,166

(22) PCT Filed: Oct. 5, 2016

(86) PCT No.: PCT/KR2016/011149
§ 371 (c)(1),
(2) Date: Apr. 5, 2018

(87) PCT Pub. No.: WO2017/061773
PCT Pub. Date: Apr. 13, 2017

(65) Prior Publication Data
US 2018/0286546 A1    Oct. 4, 2018

(30) Foreign Application Priority Data

Oct. 5, 2015  (KR) .................... 10-2015-0140018
Oct. 5, 2015  (KR) .................... 10-2015-0140020
(Continued)

(51) Int. Cl.
*H01F 1/147* (2006.01)
*H01F 41/32* (2006.01)
(Continued)

(52) U.S. Cl.
CPC ......... *H01F 1/14775* (2013.01); *B32B 9/005* (2013.01); *H01F 1/12* (2013.01);
(Continued)

(58) Field of Classification Search
CPC ... B32B 9/005; H01F 1/12; H01F 1/14; H01F 10/08; H01F 10/13; H01F 10/20;
(Continued)

(56) References Cited

U.S. PATENT DOCUMENTS

2007/0228833 A1 * 10/2007 Stevens .................. H02J 5/005
                                                          307/45
2009/0117328 A1    5/2009 Kawai et al.
(Continued)

FOREIGN PATENT DOCUMENTS

| JP | 2007123575 A | 5/2007 |
|----|---|---|
| KR | 101298660 | 8/2013 |
| KR | 20130127103 | 11/2013 |

OTHER PUBLICATIONS

International Search Report and Written Opinion for Application No. PCT/KR2016/011149 dated Feb. 10, 2017, 11 pages.

*Primary Examiner* — Jared Fureman
*Assistant Examiner* — Esayas G Yeshaw
(74) *Attorney, Agent, or Firm* — Michael Best & Friedrich LLP

(57) ABSTRACT

Provided herein is a magnetic sheet. The magnetic sheet according to one embodiment of the present invention includes a magnetic layer formed of crushed pieces of a magnetic body to improve flexibility of the magnetic sheet, and a thin film coating layer formed on at least one surface of the magnetic layer to maintain the magnetic layer in a sheet shape and buffer an external force applied to the crushed pieces of the magnetic body. According to the
(Continued)

present invention, since the magnetic sheet is improved in mechanical strength properties, such as a tensile property, a bending property, and the like, to have significantly superior flexibility, degradation of physical properties, such as magnetic permeability and the like, caused by physical damage such as unintended cracks in the magnetic body provided in the magnetic sheet can be prevented even in the process of storing, transferring, and attaching the magnetic sheet to a target object and during usage of an electronic device provided with the target object to which the magnetic sheet is attached, and the magnetic sheet can be attached to a target surface of the target object with a superior adhering force even when a stepped portion is present at the surface, and at the same time, the magnetic sheet can block the influence of a magnetic field on parts of a portable terminal device or a human body of a user using the portable terminal device, significantly increase transmission and reception efficiencies and distances of a data and/or wireless power signal, and maintain the above-described performance for a long period of time, such that the magnetic sheet can be widely used in various portable devices such as mobile devices, smart appliances, devices for the Internet of Things, and the like.

8 Claims, 11 Drawing Sheets

(30) Foreign Application Priority Data

| Oct. 5, 2015 | (KR) | .................. 10-2015-0140021 |
| Oct. 5, 2015 | (KR) | .................. 10-2015-0140022 |

(51) Int. Cl.

| H01F 10/20 | (2006.01) |
| H01F 10/08 | (2006.01) |
| H01F 1/14 | (2006.01) |
| H01F 1/12 | (2006.01) |
| H05K 9/00 | (2006.01) |
| H01F 41/02 | (2006.01) |
| H02J 7/02 | (2016.01) |
| H01F 10/13 | (2006.01) |
| B32B 9/00 | (2006.01) |
| H05K 1/16 | (2006.01) |
| H04B 5/00 | (2006.01) |
| H05K 3/00 | (2006.01) |
| H02J 50/10 | (2016.01) |
| H01F 1/34 | (2006.01) |
| H01Q 1/22 | (2006.01) |
| H01Q 7/06 | (2006.01) |

(52) U.S. Cl.
CPC ............... *H01F 1/14* (2013.01); *H01F 1/147* (2013.01); *H01F 1/34* (2013.01); *H01F 10/08* (2013.01); *H01F 10/13* (2013.01); *H01F 10/20* (2013.01); *H01F 41/02* (2013.01); *H01F 41/32* (2013.01); *H01Q 1/2208* (2013.01); *H01Q 7/06* (2013.01); *H02J 7/02* (2013.01); *H02J 50/10* (2016.02); *H04B 5/0037* (2013.01); *H04B 5/0081* (2013.01); *H05K 1/165* (2013.01); *H05K 3/0058* (2013.01); *H05K 9/00* (2013.01); *H05K 2201/083* (2013.01); *H05K 2201/10098* (2013.01)

(58) Field of Classification Search
CPC .......... H01F 41/02; H01F 41/32; H01F 1/147; H01F 1/14775; H01F 1/34; H02J 7/02; H02J 50/10; H01Q 1/2208; H01Q 7/06; H05K 2201/083; H05K 3/0058; H05K 9/00; H05K 1/165; H05K 2201/10098; H04B 5/0081; H04B 5/0037
See application file for complete search history.

(56) References Cited

U.S. PATENT DOCUMENTS

| 2010/0145568 | A1* | 6/2010 | Watanabe | .............. G07C 5/085 |
| | | | | 701/29.6 |
| 2011/0186324 | A1 | 8/2011 | Hur et al. | |
| 2011/0193416 | A1* | 8/2011 | Campanella | .............. H01Q 7/00 |
| | | | | 307/104 |
| 2012/0025761 | A1* | 2/2012 | Takada | .................... H02J 5/005 |
| | | | | 320/108 |
| 2012/0200169 | A1* | 8/2012 | Urano | ..................... H02J 5/005 |
| | | | | 307/104 |
| 2014/0143933 | A1* | 5/2014 | Low | ........................ G04C 10/00 |
| | | | | 2/170 |
| 2014/0362505 | A1 | 12/2014 | Jang et al. | |
| 2015/0326028 | A1* | 11/2015 | Suzuki | ................... H02J 7/025 |
| | | | | 307/104 |
| 2015/0333530 | A1* | 11/2015 | Moyer | .................... H02J 5/005 |
| | | | | 307/104 |
| 2016/0064814 | A1 | 3/2016 | Jang et al. | |

* cited by examiner

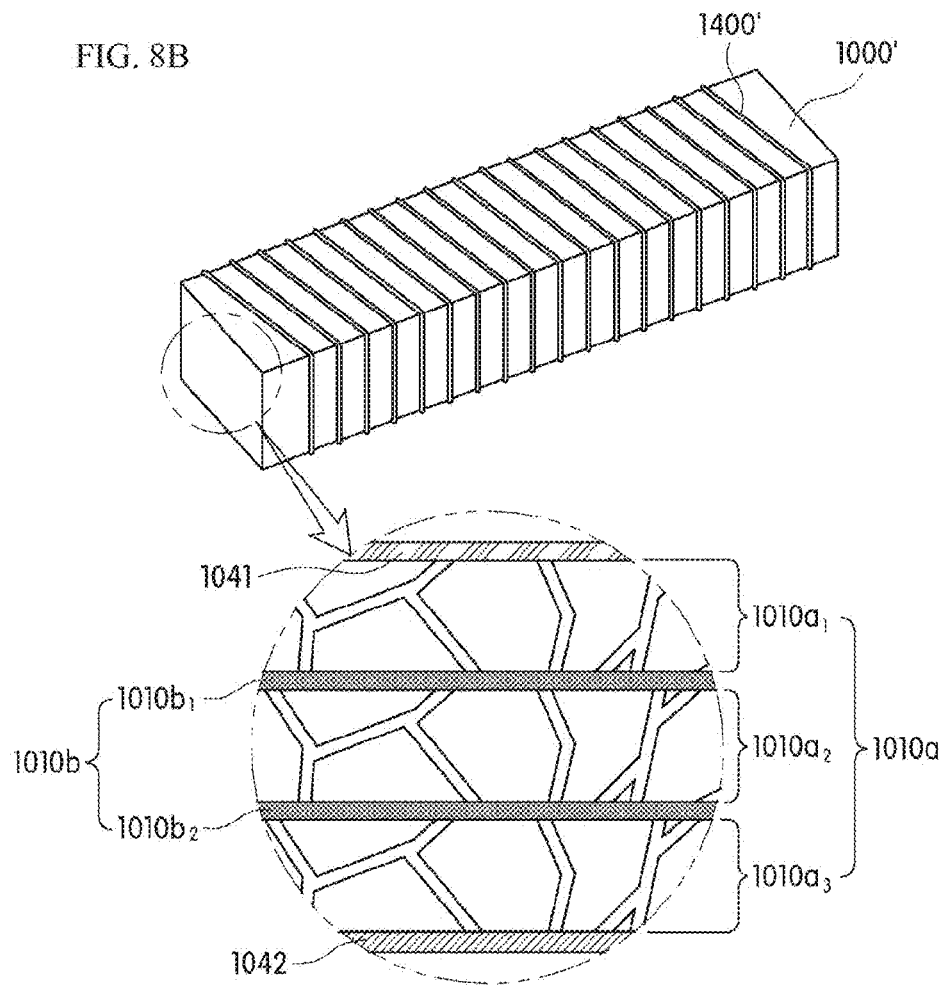

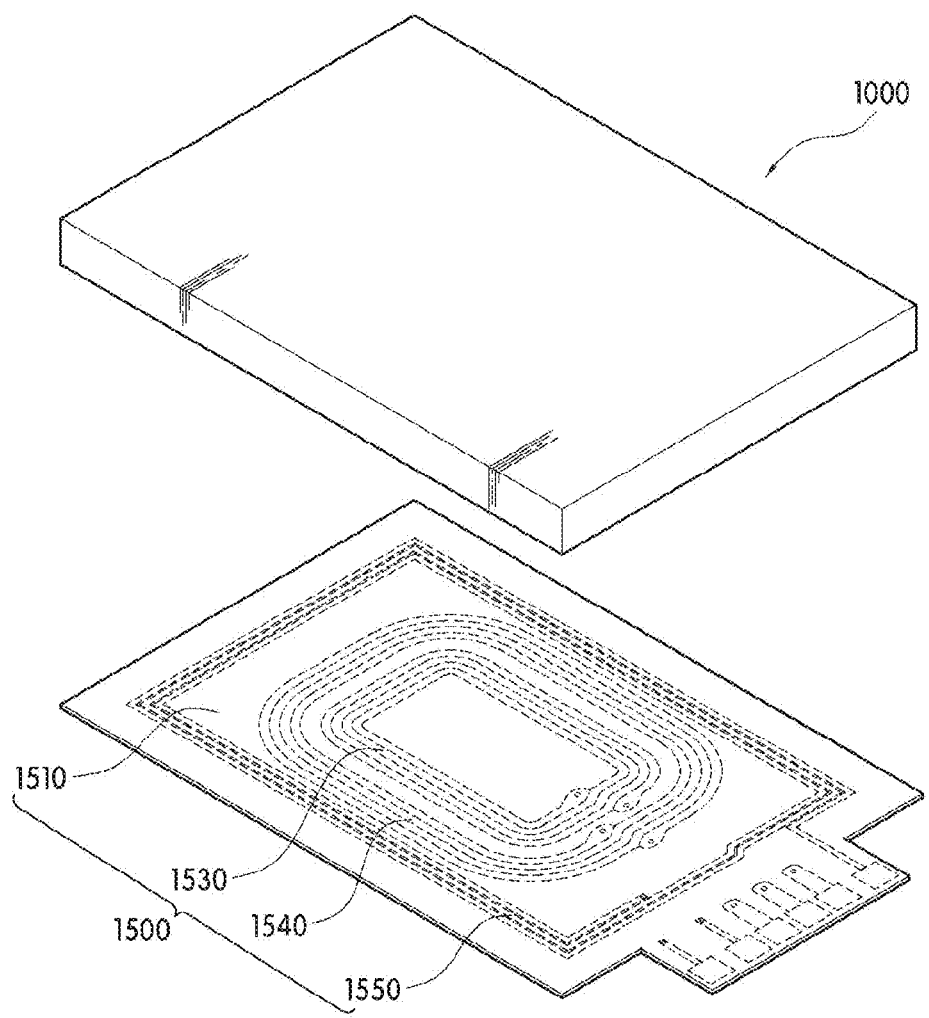

MAGNETIC SHEET, MODULE COMPRISING SAME, AND PORTABLE DEVICE COMPRISING SAME

CROSS REFERENCE TO RELATED APPLICATIONS

The present application is a national phase application of Application No. PCT/KR2016/011149, filed Oct. 5, 2016, which claims priority to Korean Application No. 10-2015-0140018, filed Oct. 5, 2015, Korean Application No. 10-2015-0140020, filed Oct. 5, 2015, Korean Application No. 10-2015-0140021, filed Oct. 5, 2015, and Korean Application No. 10-2015-0140022, filed Oct. 5, 2015, the entire contents of all of which are herein incorporated by reference.

DESCRIPTION OF DRAWINGS

FIG. 2A is a diagram illustrating that a portion of a thin film coating layer formed on one surface of a magnetic layer penetrates into a portion of a space between magnetic pieces, and FIG. 2B is a diagram illustrating that a portion of a thin film coating layer formed on both sides of a magnetic layer penetrates into an entire space between magnetic pieces.

FIGS. 5A and 5B are diagrams illustrating a manufacturing process using a crushing device which crushes a magnetic body through irregularities provided in rollers, and FIG. 6 is a diagram illustrating a manufacturing process using a crushing device which crushes the magnetic body through metal balls provided on a support plate.

FIGS. 8A and 8B are perspective views of a low frequency antenna according to an embodiment of the present invention, FIG. 8A is a diagram illustrating a low frequency antenna in which a magnetic sheet according to an embodiment of the present invention is implemented as a magnetic field unit and is disposed at both surfaces of an antenna core, and FIG. 8B is a diagram illustrating a low frequency antenna using a magnetic sheet according to an embodiment of the present invention as an antenna core.

FIGS. 9 and 10 are exploded perspective views of a wireless power transmission module according to an embodiment of the present invention, and FIG. 10 is a diagram illustrating a wireless power transmission module including an antenna unit having an antenna for wireless power transmission which operates through a magnetic resonance method and has an operating frequency band including 6.78 MHz, and an antenna for wireless power transmission which operates through a magnetic induction method and has an operating frequency band including 100 kHz.

MODES OF THE INVENTION

Figure 1:
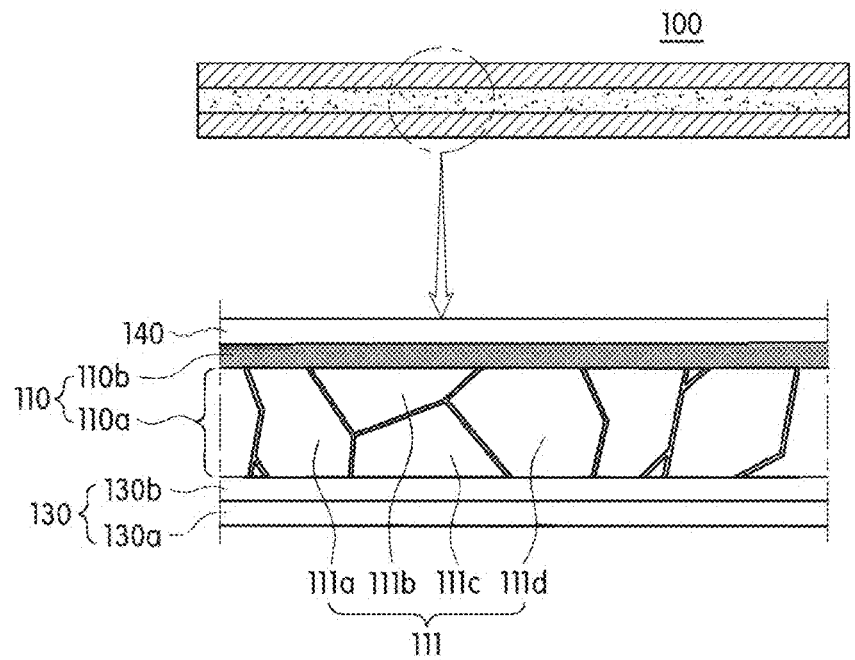
FIG. 1 is a cross-sectional view of a magnetic sheet according to an embodiment of the present invention.

Hereinafter, embodiments of the present invention will be fully described in detail with reference to the accompanying drawings so as to facilitate implementation by those skilled in the art to which the present invention pertains. The present invention may be implemented in various different forms, and thus it is not limited to embodiments to be described herein. In the drawings, some portions not related to the description will be omitted and not shown in order to clearly describe the present invention, and the same or similar reference numerals are given to the same or similar components throughout this disclosure.

As shown in FIG. 1, a magnetic sheet 100 according to an embodiment of the present invention includes a magnetic layer 110*a* and a thin film coating layer 110*b* formed on at least one side of the magnetic layer, and the magnetic layer 110*a* is formed of a plurality of magnetic pieces 111. The magnetic sheet 100 may further include a protective member 140 disposed on a top of the thin film coating layer 110*b* and an adhesive member 130 disposed below the magnetic layer 110*a*, and the adhesive member 130 may include a first adhesive layer 130*b* and a release film 130*a* for protecting the first adhesive layer 130*b* before the magnetic sheet 100 is attached to a target object.

Figure 2A:
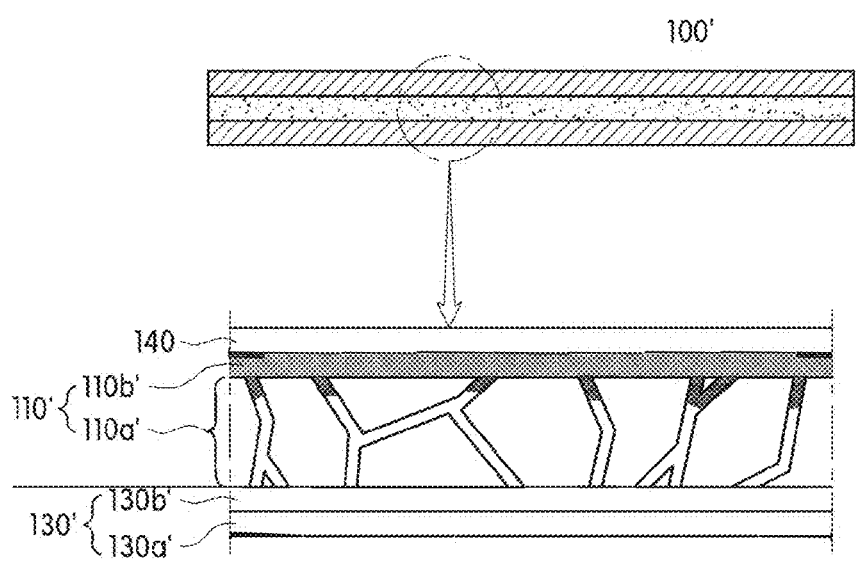
FIGS. 2A and 2B are cross-sectional views of a magnetic sheet according to an embodiment of the present invention.

Further, as shown in FIG. 2A, a magnetic sheet 100' according to an embodiment of the present invention is configured such that a thin film coating layer 110*b*' may partially penetrate into a space between at least some of adjacent magnetic pieces to enhance a supporting force for the magnetic pieces and serve to perform buffering capable of preventing damage such as fine fragmentation, breakage, and the like of the magnetic pieces caused by collisions between the magnetic pieces when flexural strength is applied to the magnetic sheet.

Figure 2B:
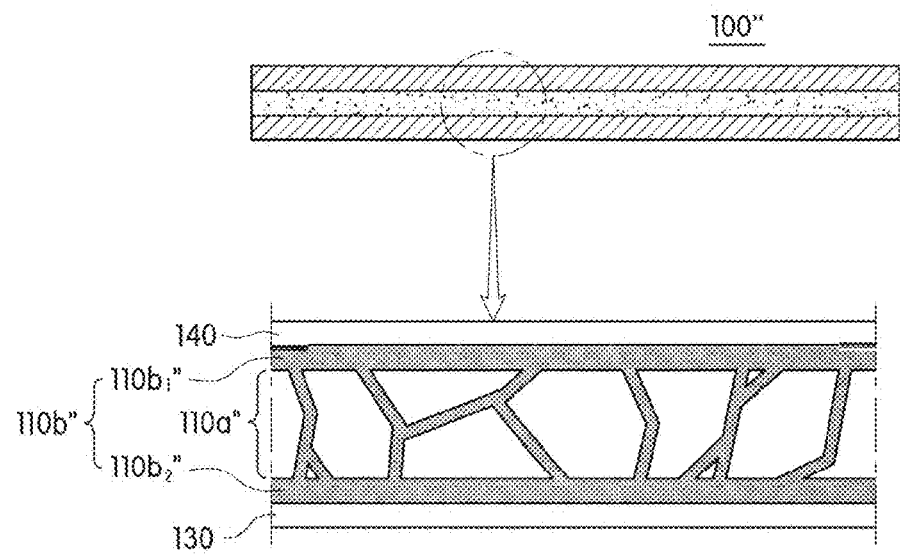

Furthermore, as shown in FIG. 2B, a magnetic sheet 100" according to an embodiment of the present invention is configured such that a thin film coating layer 110*b*" may be formed on both sides of a magnetic layer 110*a*", and the thin film coating layer 110*b*" may penetrate into an entire space between adjacent magnetic pieces.

Meanwhile, as shown in FIGS. 2A and 2B, when the thin film coating layer 110*b*' or 110*b*" partially or entirely penetrates between the magnetic pieces, the thin film coating layer 110*b*' or 110*b*" serves as a dielectric such that there is an advantage in that a magnetic loss due to an eddy current can be minimized. At this point, a magnetic body provided in the magnetic layer may be a magnetic body in which electrical resistance is low and thus a magnetic loss caused by an eddy current may occur (e.g., a magnetic body such as a Fe—Si—B-based amorphous alloy). In this case, the thin film coating layer penetrating into the space between the magnetic pieces serves as a dielectric to significantly increase the electric resistance of the magnetic layer such that the magnetic loss caused by the eddy current may be prevented, heat generation may be minimized, and transmission and reception efficiencies of a signal through a magnetic field may be sustained with high sensitivity.

However, when the magnetic body provided in the magnetic layer is a magnetic body having high electrical resistance and no magnetic loss caused by an eddy current (e.g., a ferrite-based magnetic body), unlike FIGS. 1, 2A, and 2B, it may be more advantageous to exhibit a desired magnetic property by having the thin film coating layer not penetrate between crushed pieces and thus the crushed pieces are maintained in a state of being in contact with each other.

A cross-sectional structure of the magnetic sheet according to one embodiment of the present invention will be described below when the magnetic body is an amorphous alloy.

Specifically, the magnetic layers 110*a*, 110*a*', or 110*a*" is formed of the magnetic pieces 111, which are made by crushing the magnetic body, so as to improve flexibility of the magnetic sheet.

It may be advantageous for the magnetic body to have a shape such as a ribbon sheet or a plate-shaped sheet so as to be easily implemented as a thin film. A thickness of a provided magnetic body should also be very thin for slimness and thinness of the magnetic sheet, and when a thickness of the magnetic sheet becomes thinner, conventional magnetic bodies provided in the magnetic sheet are very brittle and thus cracks occur in the conventional magnetic bodies even when a very weak external force is applied thereto or the conventional magnetic bodies are broken into fine pieces, such that there is a problem in that magnetic permeability after the cracks occur is significantly degraded than that before the cracks occur in the sheet phase.

Further, a very thin magnetic sheet has a problem of significantly degrading workability when stored, transferred, and put into a process as a part of a product after manufactured. Specifically, a magnetic sheet is generally disposed on a surface at which an antenna and the like are formed and is generally attached to and brought into close contact with the surface at which the antenna is formed so as to further improve an antenna characteristic and prevent the magnetic sheet from escaping. To describe the above described attachment with reference to FIG. 1, the magnetic sheet 100 may be attached to a target surface (not shown) through the adhesive member 130, and to this end, the release film 130*a* protecting the first adhesive layer 130*b* of the adhesive member 130 is firstly removed. However, an external force of a certain level or more is required to peel the release film 130*a* from the magnetic sheet 100, and when a thickness of the magnetic sheet is very thin, a significantly large number of cracks occur due to the external force. Consequently, there is a problem in that workability is significantly degraded since great effort is made to peel the release film so as to prevent generation of the cracks and degradation of a physical property due to the cracks. Further, even when a portable device is manufactured with great effort to prevent occurrence of cracks in the magnetic sheet, cracks or breakage occurs in the magnetic sheet due to an impact such as dropping during usage of a product by a user such that there is a problem in that transmission and reception efficiencies or distances of a desired level are not secured.

However, the magnetic sheet according to the present invention is provided with a magnetic body in a state of initially crushed magnetic pieces so as to significantly improve flexibility of the magnetic sheet such that a concern in which cracks may further occur in the magnetic body due to an external force can be fundamentally resolved even when a cross-sectional thickness of the magnetic sheet becomes thinner. Further, the magnetic body is included in the magnetic sheet in a state of magnetic pieces, and the magnetic sheet including the magnetic body in the state of magnetic pieces has an initial physical property capable of exhibiting a superior characteristic in transmission and reception efficiencies and distances for a signal related to an initially desired function and maintains the initial physical property even in the process of manufacturing a finished product provided with the magnetic sheet and further during usage of the finished product, such that concerns in which physical property degradation caused by unintended fragmentation occurring in a magnetic sheet having a conventional non-fragmented magnetic body and significant degradation in signal transmission and reception performance due to the physical property degradation can be resolved.

Figure 3:
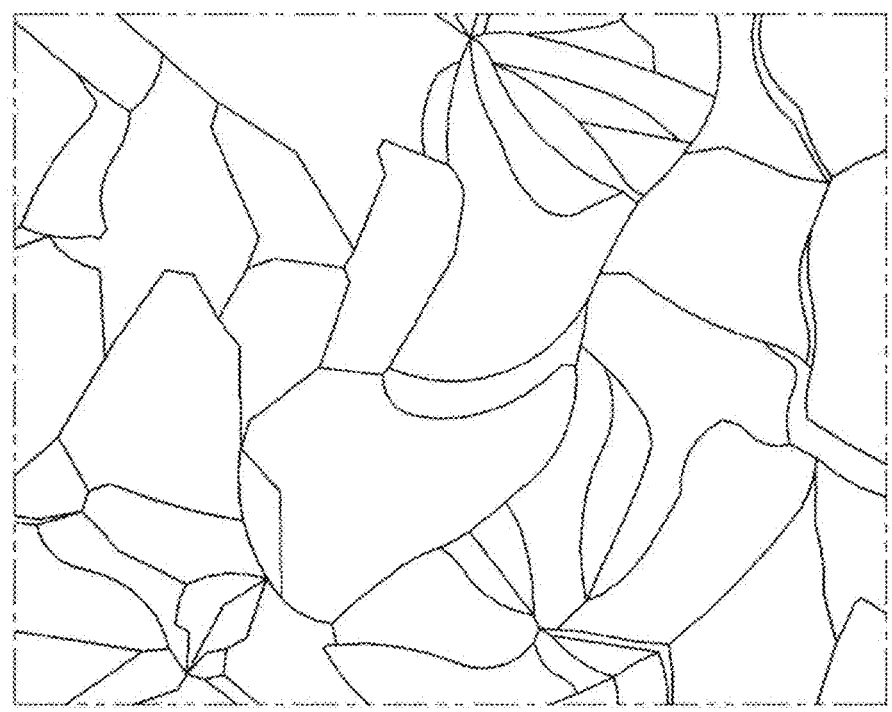
FIG. 3 is a schematic diagram illustrating shapes of pieces observed on one surface of a magnetic layer formed of magnetic pieces in a magnetic sheet according to an embodiment of the present invention.

Meanwhile, the magnetic pieces may have amorphous shapes. However, in order to further prevent unintended additional damage, pieces, and breakage of the magnetic pieces which may occur as the magnetic sheet is flexed or bent, at least one side of some of the magnetic pieces may be preferably crushed to have a curved shape instead of a straight line (see FIG. 3). When a magnetic piece having one side in a curved shape is included in the magnetic sheet and the magnetic sheet is bent, collisions or friction between adjacent magnetic pieces may be reduced such that there is an advantage in that additional breakage of the magnetic pieces can be prevented.

Further, the number of magnetic pieces, each of which has at least one side in a curved shape, may be 10% or more of the total number of magnetic pieces in the magnetic layer, preferably 30% or more thereof, more preferably 50% or more thereof, and most preferably 70% or more thereof. When the number of the magnetic pieces, each of which has at least one side in the curved shape, is less than 10% of the total number of the magnetic pieces, improvement in flexibility may be insignificant and the number of magnetic pieces that are finer than the initially provided magnetic pieces may be increased by an external impact such that there is a problem in that degradation in a physical property such as reduction in magnetic permeability may be caused.

Further, an average particle diameter of a single piece of the magnetic pieces may be in the range of 50 to 5000 μm. When the average particle diameter exceeds 5,000 μm, additional breakage and fragmentation of the magnetic pieces are increased such that there is a problem in that it may be difficult for a design value of an initial physical property of the magnetic sheet to be maintained. Further, when the average particle diameter of the magnetic piece is less than 50 μm, it is difficult to manufacture a magnetic sheet exhibiting a physical property of a desired level because a magnetic property significantly lower than a magnetic property such as magnetic permeability of the magnetic body before being crushed is exhibited, and specifically, it is more difficult to satisfy a desired physical property relative to a thin thickness. The average particle diameter of the magnetic piece refers to an average volumetric diameter measured by a laser diffraction type particle size distribution meter.

Meanwhile, in order to further prevent additional breakage and fragmentation of the magnetic pieces, the magnetic pieces may include pieces each having a degree of differentiation of 8.0 or less for one surface thereof according to Equation 1, preferably 6.5 or less, more preferably 4.0 or less, even more preferably 3.5 or less, even more preferably 3.0 or less, even more preferably 2.5 or less, even more preferably 2.0 or less, and most preferably 1.5 or less, in an amount of 10% or more, preferably 20% or more, more preferably 30% or more, even more preferably 40% or more, even more preferably 50% or more, even more preferably 60% or more, and most preferably 70% or more.

$$\text{degree of differentiation} = \frac{\text{diameter of circumscribed circle of piece (µm)}}{\text{diameter of inscribed circle of piece (µm)}} \quad [\text{Equation 1}]$$

Figure 4A:
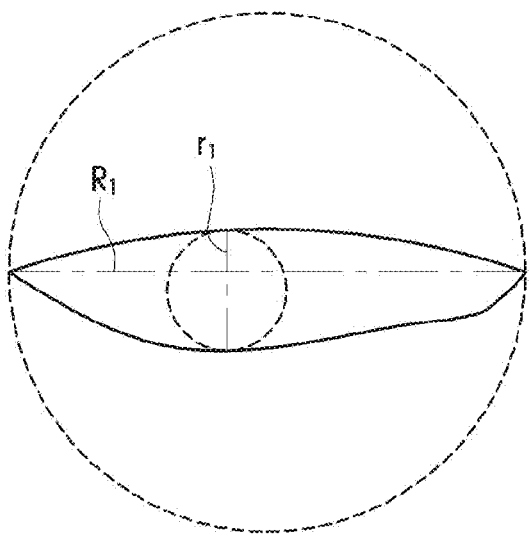
FIGS. 4A and 4B are diagrams illustrating diameters of a circumscribed circle and an inscribed circle of a piece for evaluating a degree of differentiation of a magnetic piece having an amorphous shape.
Figure 4B:
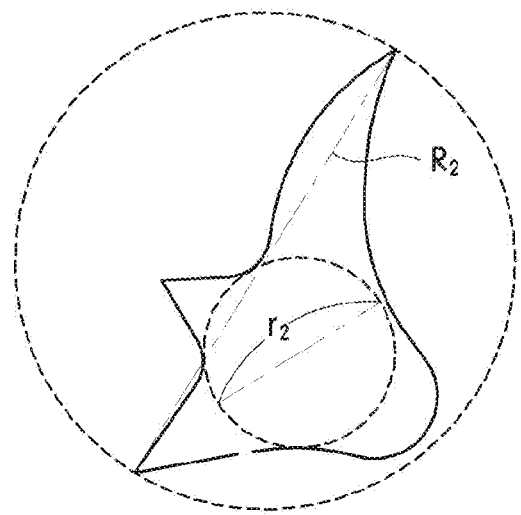

In Equation 1, a diameter of a circumscribed circle of a magnetic piece refers to a longest distance between two points on one surface of the magnetic piece ($R_1$ of FIG. 4A and $R_2$ of FIG. 4B), and at this point, a circle passing the two points of the magnetic piece corresponds to the circumscribed circle of the magnetic piece. Further, a diameter of an inscribed circle of a magnetic piece refers to a diameter of an inscribed circle having a largest diameter among inscribed circles in contact with two or more sides which are present in any surface of the magnetic piece ($r_1$ of FIG. 4A and $r_2$ of FIG. 4B). A large degree of differentiation for one surface of the magnetic piece means that the one surface of the magnetic piece has a long shape (see FIG. 4A) or includes a pointed portion (see FIG. 4B), and the long shape or the pointed portion means that additional breakage or fragmentation may occur.

Thus, since the number of magnetic pieces, each of which has a large degree of differentiation, among the magnetic pieces included in the magnetic layers 110a, 110a', or 110a" is preferably contained in an amount of a predetermined ratio or less, a magnetic piece having a degree of differentiation of 8.0 or less for one surface of the magnetic piece according to Equation 1 may be contained in an amount of 10% or more relative to all magnetic pieces in the magnetic layer, and more preferably, the magnetic piece having the above-described degree of differentiation may be contained in an amount of 20% or more. When a magnetic piece having a degree of differentiation exceeding 8.0 is contained in an amount of less than 10%, the magnetic piece is further finely fragmented and thus significant degradation of the physical properties such as magnetic permeability and the like may be caused, and a design value of the desired initial physical property may not be maintained.

Meanwhile, when a magnetic body that can be included in the magnetic layer according to the present invention is capable of exhibiting a physical property such as magnetic permeability of a magnetic sheet, which will be described below, in a fragmented state, there is no limitation on a composition, a crystal type, and a fine structure of a sintered particle and thus a magnetic body provided in a known magnetic sheet may be used. As one example of the above described, the magnetic body may be a soft magnetic material. Since the soft magnetic material has a very low coercive force with respect to a residual magnetic flux density and has large magnetic permeability, a blocking effect against electromagnetic fields is superior. The soft magnetic material may include at least one of a metallic soft magnetic material and ferrite. At this point, the metallic soft magnetic material may include one or more selected from the group consisting of a Ni—Co-based alloy, a Fe—Ni-based alloy, a Fe—Cr-based alloy, a Fe—Al-based alloy, a Fe—Si-based alloy, a Fe—Si—B-based alloy, and a Fe—Si—B—Cu—Nb-based alloy. Further, the ferrite may include at least one selected from the group consisting of Mn—Zn-based ferrite, Ni—Zn-based ferrite, Ni—Co-based ferrite, Mg—Zn-based ferrite, Cu—Zn-based ferrite, and cobalt-substituted Y or Z hexagonal-based ferrite. At this point, the ferrite may include ferrite, e.g., Ni—Cu—Zn-based ferrite or Ni—Cu—Co—Zn-based ferrite, containing iron oxide and at least three oxides of metals selected from the group consisting of, nickel, zinc, copper, magnesium, and cobalt, but the present invention is not limited thereto. At this point, contents of nickel, zinc, copper, magnesium, and cobalt in the ferrite may be varied according to the purpose, and thus the present invention is not particularly limited thereto.

Further, the magnetic body included in one embodiment of the present invention may employ a thin plate magnetic material which is made of an amorphous alloy or a nanocrystalline alloy.

As the amorphous alloy, a Fe-based or a Co-based amorphous alloy may be employed, and it may be preferable for the Fe-based amorphous alloy to be employed in consideration of a unit cost of production. For example, as the Fe-based amorphous alloy, a Fe—Si—B-based amorphous alloy may be employed, and in this case, it is preferable that Fe is in the range of 70 to 90 at % and the sum of Si and B is in the range of 10 to 30 at %. A saturation magnetic flux density becomes higher as contents of metals including Fe and the like becomes higher, but when the content of Fe is excessive, since it is difficult to form an amorphous shape, the content of Fe is preferably in the range of 70 to 90 at %. Further, when the sum of Si and B is in the range of 10 to 30 at %, amorphous formability of the alloy is most superior. In order to prevent corrosion in such a basic composition, corrosion resistance elements such as Cr, Co, and the like may be added in an amount of 20 at % or less, and a small amount of other metal elements may be added to impart other properties as necessary. For example, the Fe—Si—B-based alloy may have a crystallization temperature of 508° C. and a Curie temperature Tc of 399° C. However, such a crystallization temperature may be varied according to contents of Si and B, and other metal elements and contents thereof which are added in addition to ternary alloy components.

Further, the magnetic body included in one embodiment of the present invention may be a Fe—Si—B—Cu—Nb-based amorphous alloy. The copper contained in the amorphous alloy may enhance corrosion resistance of the amorphous alloy and prevent a size of a crystal from becoming larger even when the crystal is generated, and at the same time, improve magnetic properties such as magnetic permeability and the like. The copper is preferably contained in the amorphous alloy in the range of 0.01 to 10 at %, and when the copper is contained in an amount of less than 0.01 at %, an effect obtained from the copper may be insignificantly exhibited, and when the copper is contained in an amount of exceeding 10 at %, there is a problem in that it is difficult for the amorphous alloy to be produced. Further, the niobium (Nb) contained in the amorphous alloy may improve the magnetic properties such as the magnetic permeability and the like, and is preferably contained in the amorphous alloy in the range of 0.01 to 10 at %, and when Nb is contained in an amount of less than 0.01 at %, an effect obtained from Nb may be insignificantly exhibited, and when Nb is contained in an amount of exceeding 10 at %, there is a problem in that it is difficult for the amorphous alloy to be produced.

Meanwhile, a thickness of the magnetic layer 110a may be a thickness of the magnetic sheet which is the origin of the magnetic pieces, and preferably, a thickness of a single layer of the magnetic layer may be in the range of 1 µm to 300 µm but is not limited thereto.

Further, a shape of the magnetic layer may have a shape according to application of the magnetic sheet, e.g., when used for near-field communication (NFC), a shape of the magnetic layer may have a polygonal shape such as a pentagonal shape, a circular shape, an elliptical shape, or a mixed shape in which a curved line and a straight line are partially mixed in addition to a quadrangular shape having a rectangular shape and a square shape so as to correspond to an antenna form for NFC. At this point, a size of the magnetic sheet (or the magnetic layer) is preferably formed to be about 1 to 2 mm wider than an antenna size of a corresponding module.

Next, the thin film coating layer 110*b* formed on at least one surface of the above-described magnetic layer 110*a* will be described.

The thin film coating layer 110*b* serves to form the magnetic pieces which are crushable and separable as a layer by fixing and supporting each of the magnetic pieces, thereby maintaining the magnetic layer in a sheet shape and at the same time, serves to buffer an external force applied to the magnetic pieces and to prevent oxidation of the magnetic body due to moisture infiltration.

Specifically, the thin film coating layer 110*b* may be easily attached to the magnetic pieces, may have superior sheet shape retentivity as a coating layer, may not have a significantly low bending property so as to be easily broken by an external force or reduce flexibility of the magnetic layer, may have superior film properties to be implemented as a thin film, and may be used as a preferable thin film coating layer without limitation as long as it is a slightly tacky material at room temperature and thus workability is not deteriorated.

The thin film coating layer 110*b* may be formed by solidifying a composition for forming a thin film coating layer containing at least one of a natural polymer compound and a synthetic polymer compound. A method for solidifying the composition for forming a thin film coating layer is not particularly limited. For example, any one of solidification by drying or curing through solvent volatilization, solidification by curing through a chemical reaction by heat, light, moisture, or the like, and solidification by cooling after heat melting such as a hot melt type may be used as a solidification reaction without limitation.

Specifically, the natural polymer compound may include one or more of a protein-based polymer compound such as glue, gelatin, or the like, a carbohydrate-based polymer compound such as starch, cellulose, a cellulose derivative, complex polysaccharides, or the like, and a natural rubber-based compound such as latex or the like.

Further, the synthetic polymer compound may include one or more of a thermoplastic polymer compound, a thermosetting polymer compound, and a rubber-based compound.

The thermoplastic polymer compound may include one or more of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a (meth)acrylic-based resin, polyamide, thermoplastic polyester (e.g., polyethylene terephthalate (PET), polybutylene terephthalate (PBT), and the like), polycarbonate, a polyphenylene sulfide resin, polyamideimide, polyvinyl butyral, polyvinyl formal, polyhydroxy polyether, polyether, polyphthalamide, a fluorine-based resin (e.g., polytetrafluoroethylene (PTFE) and polychlorotrifluoroethylene (PCTFE)), a phenoxy resin, a polyurethane resin, a nitrile butadiene resin, and the like. Further, the thermosetting polymer may include one or more of a phenolic-based resin (PE), a urea-based resin (UF), a melamine-based resin (MF), an unsaturated polyester-based resin (UP), an epoxy resin, and the like. Furthermore, the rubber-based compound may include one or more of styrene-butadiene rubber (SBR), polybutadiene rubber (BR), acrylonitrile-butadiene rubber (NBR), polyisobutylene (PIB) rubber, acrylic rubber, fluorine rubber, silicone rubber, chloroprene, and the like.

The thin film coating layer 110*b* may more preferably be formed by solidifying the rubber-based compound to prevent unintended fine fragmentation of the magnetic body through enhancement in buffering of a thin film coating layer and to further improve flexibility of the magnetic sheet, and the rubber-based compound may more preferably be ethylene propylene diene monomer (EPDM) rubber.

At this point, a copolymerization molar ratio of each of the monomers may be varied according to the purpose, so that the present invention is not particularly limited to the aforementioned.

When the composition for forming a thin film coating layer employed to form the thin film coating layer 110*b* is solidified through a curing reaction, a curable component capable of curing the above-described polymers may further be included, and in some cases, a solvent and a curing accelerator may further be included.

Further, when the curable component is a known component, it may be used without particular limitation, and as a non-limiting example, an amine compound, a phenolic resin, an acid anhydride, an imidazole compound, a polyamine compound, a hydrazide compound, a dicyandiamide compound, and the like may be used alone or in combination of two or more thereof. Aromatic amine compound curable components may include m-xylenediamine, m-phenylenediamine, diaminodiphenylmethane, diaminodiphenylsulfone, diaminodiacyldiphenylmethane, diaminodiphenyl ether, 1,3-bis(4-aminophenoxy)benzene, 2,2'-bis [4-(4-aminophenoxy)phenyl]propane, bis [4(4-aminophenoxy)phenyl]sulfone, 4,4'-bis(4-aminophenoxy)biphenyl, 1,4-Bis (4-aminophenoxy)benzene, and the like, and these curable components may be used alone or in combination thereof. Further, phenolic resin curable components may include a phenol novolac resin, a cresol novolac resin, a bisphenol-A novolac resin, a phenol aralkyl resin, a poly(p-vinylphenol) t-butylphenol novolac resin, a naphthol novolac resin, and the like, and these curable components may be used alone or in combination thereof. A curable component content is preferably in the range of 20 to 60 parts by weight per 100 parts by weight of the above-described polymer, and when the curable component content is less than 10 parts by weight, a curing reaction is insignificant and thus a bending or tensile property of a desired level may not be exhibited, and when the curable component content exceeds 60 parts by weight, reactivity of the curable component with the polymer becomes higher and thus physical properties such as handleability and long-term storage may be deteriorated.

Further, the curing accelerator may be determined according to specific types of the selected polymer and curable component and thus it is not particularly limited in the present invention, and as a non-limiting example, curing accelerators may include amine-based, imidazole-based, phosphorus-based, boron-based, and phosphorus-boron-based curing accelerators and these curing accelerators may be used alone or in combination thereof. A curing accelerator content is preferably in the range of about 0.1 to 10 parts by weight, and more preferably in the range of 0.5 to 5 parts by weight based on 100 parts by weight of the polymer.

Further, the solvent may be used without limitation in a case in which the solvent is usually used in a coating composition, and as a non-limiting example, the solvent may be a type of ketone such as acetone, methyl ethyl ketone (MEK), methyl isobutyl ketone (MIBK), cyclohexanone, and the like, or a type of ether such as methyl cellosolve, ethylene glycol dibutyl ether, butyl cellosolve acetate, and the like. An amount of the solvent used is not particularly limited but is preferably in the range of 10 to 500 parts by weight based on 100 parts by weight of the polymer.

Further, one or two or more of various additives including a pH adjuster, an ion capturing agent, a viscosity adjusting agent, a thixotropic agent, an antioxidant, a heat stabilizer, a light stabilizer, an ultraviolet absorber, a colorant, a dehydrating agent, a flame retardant, an antistatic agent, an antifungal agent, an antiseptic agent, and the like may be added to the composition for forming a thin film coating layer as necessary.

The pH adjuster is not particularly limited, and examples thereof may include acidic fillers such as silica and the like, or alkaline fillers such as calcium carbonate and the like. These pH adjusters may be used alone or in combination of two or more thereof. The ion capturing agent is not particularly limited as long as it can reduce an amount of ionic impurities, and examples thereof may include aluminosilicate, hydrated titanium oxide, hydrated bismuth oxide, zirconium phosphate, titanium phosphate, hydrotalcite, ammonium molybdophosphate, hexacyano zinc, an organic ion exchange resin, and the like, these ion capturing agents may be used alone or in combination of two or more thereof. Other known additives may be used, and thus detailed descriptions of specific types thereof will be omitted.

Meanwhile, the thickness of the thin film coating layer 110b is preferably implemented within 10 μm, and in terms of thinness, the thickness is preferably implemented with 5 μm or less. However, when the thickness is implemented with less than 5 μm, the chipping off and floating of the magnetic pieces may not be prevented and thus there may be a problem in that the thin film coating layer is easily torn due to weak mechanical strength or is torn or damaged due to the magnetic pieces.

Meanwhile, as shown in FIG. 1, the protective member 140 may be disposed on the top of the thin film coating layer 110b, and the adhesive member 130 having the release film 130a and the adhesive layer 130b formed on one surface of the release film 130a may further be included below the magnetic layer 110a.

The protective member 140 may primarily prevent an external force from being directly applied to the magnetic body in the process of crushing the magnetic sheet and prevent scattering of a magnetic powder generated in the crushing process, thereby helping to maintain a comfortable workplace environment. Further, in the process of attaching the magnetic sheet to a substrate having an antenna, the protective member 140 serves to protect the magnetic sheet from heat, a pressure, and the like which are applied to cure an adhesive. The protective member 140 may be a protective film which is generally provided in the magnetic sheet, and any protective member may be used without limitation as long as it is made of a material securing heat resistance sufficient to withstand the heat or external force applied in the process of crushing or attaching the magnetic sheet, and mechanical strength and chemical resistance sufficient to protect the magnetic layer 110a from externally applied physical and chemical stimuli. As a non-limiting example, protective films may include a polyethylene film, a polypropylene film, a polyimide film, a crosslinked polypropylene film, a nylon film, a polyurethane-based resin film, an acetate film, a polybenzimidazole film, a polyimideamide film, a polyetherimide film, a polyphenylene sulfide (PPS) film, a PET film, a polytrimethylene terephthalate (PTT) and PBT film, a polyvinylidene fluoride (PVDF) film, a PTFE and PCTFE film, a polyethylene tetrafluoroethylene (ETFE) film, and the like, and these protective films may be used alone or in combination thereof.

Further, the protective member 140 having a thickness in the range of 1 to 100 μm, preferably in the range of 10 to 30 μm, may be used but is not limited thereto.

Furthermore, the protective member 140 may be directly attached to the thin film coating layer 110b without a separate adhesive member or may be attached by interposing a separate adhesive member. However, for the purpose of thinness of the magnetic sheet, the protective member 140 is preferably directly attached to the thin film coating layer 110b without interposing an adhesive member.

Next, the adhesive member 130 serves to attach the magnetic sheet 100 to an antenna or a substrate provided with the antenna. As shown in FIG. 1, the adhesive member 130 may include the first adhesive layer 130b for attaching the magnetic sheet 100 to a target surface and may further include the release film 130a for protecting the first adhesive layer 130b. In the present invention, a generally known release film may be used as the release film 130a without particular limitation as long as it can be easily removed from the first adhesive layer 130b, and the release film 130a may be removed from the magnetic sheet 100 before the magnetic sheet 100 is attached to a target surface.

The first adhesive layer 130b may be formed by applying a composition for forming an adhesive layer to a lower portion of the magnetic layer 110a or may be provided such that the first adhesive layer 130b formed by applying the composition for forming an adhesive layer on the release film 130a is attached to the magnetic layer 110a or 110a'. Alternatively, the first adhesive layer 130b may be a double-sided adhesive layer in which the composition for forming an adhesive layer is coated on both sides of a support film to reinforce mechanical strength.

The above-described magnetic sheet may be manufactured by a first manufacturing method and a second manufacturing method which will be described below but the present invention is not limited thereto, and the first manufacturing method will be described first.

The magnetic sheet may be manufactured by the first manufacturing method according to the present invention including an operation (1) of forming a thin film coating layer on at least one surface of the magnetic sheet, and an operation (2) of crushing the magnetic sheet having the thin film coating layer formed thereon, and first, in the operation (1) according to one embodiment of the present invention, the forming of the thin film coating layer on at least one surface of the magnetic sheet is performed.

The magnetic sheet may be manufactured by a known manufacturing method for each type of magnetic material or may employ a commercially available magnetic sheet.

As an example of directly manufacturing the magnetic sheet, when the magnetic material is a Ni—Zn—Cu—Co-based ferrite sheet, the corresponding ferrite is manufactured as follows. First, a raw material mixture is obtained by mixing nickel oxide, zinc oxide, copper oxide, cobalt oxide, and iron trioxide in a predetermined composition ratio. At this point, the raw material mixture may be mixed through dry or wet mixing, and a particle diameter of a mixed raw material is preferably in the range of 0.05 to 5 μm. Components such as the nickel oxide and the zinc oxide included in the raw material mixture may be respectively included in the raw material or may be included in the raw material in the form of a composite oxide containing the respective components, and the cobalt oxide may also be included in the raw material in the form of cobalt ferrite or cobalt tetraoxide.

Next, plasticization is performed on the raw material mixture to obtain a plasticized material. Plasticization is performed to promote pyrolysis of the raw material, homogenization of the components, generation of ferrite, disappearance of ultrafine powder by sintering, and particle growth to an appropriate particle size, thereby converting the raw material mixture into a form suitable for the subsequent process. Such plasticization may be preferably performed at a temperature in the range of 800 to 1100° C. for about 1 to 3 hours. Plasticization may be performed under an air atmosphere or an atmosphere in which an oxygen partial pressure is higher than that of the air atmosphere.

Next, the obtained plasticized material is crushed to obtain a crushed material. Crushing is performed to break up the agglomeration of the plasticized material to obtain a powder having an appropriate degree of a sintering property. When the plasticized material forms a large lump, wet crushing may be performed using a ball mill, an attritor, or the like after coarse crushing is performed. Wet crushing may be performed until an average particle diameter of the crushed material is preferably in the range of 0.5 to 2 μm.

Then, the crushed material is slurried together with additives such as a solvent, a binder, a dispersant, a plasticizer to manufacture a paste. A ferrite sheet having a thickness in the range of 50 to 350 μm may be formed using the paste. After the ferrite sheet is processed into a predetermined shape, binder removal and calcination may be performed to manufacture the ferrite sheet. Calcination may preferably be performed at a temperature in the range of 900 to 1300° C. for about 2 to 5 hours, and at this point, calcination may be performed under an air atmosphere or an atmosphere in which an oxygen partial pressure is higher than that of the air atmosphere. Alternatively, as another embodiment of manufacturing the ferrite sheet, the ferrite sheet may be manufactured by a known method such as powder compression molding, injection molding, calendering, extruding, or the like after a ferrite powder and a binder resin are mixed.

To form the thin film coating layer on the magnetic sheet obtained by the above-described method, an operation 1-1) of applying the composition for forming a thin film coating layer on at least one surface of the magnetic sheet, and an operation 1-2) of partially solidifying or solidifying the applied composition for forming a thin film coating layer may preferably be performed.

First, in the operation 1-1), the composition for forming a thin film coating layer may include the above-described polymer and the above-described curable components and may further include a solvent in the case of a solvent curing type. The composition for forming a thin film coating layer may have a viscosity in the range of 10 to 3000 cps so as to uniformly apply the thin film with a very thin thickness, but the viscosity may be varied according to a specific method of applying the composition for forming a thin film coating layer on the magnetic sheet, and as one example, the viscosity may be in the range of 1000 to 30000 cps in the case of silk screening.

Any method of applying the composition for forming a thin film coating layer on the magnetic sheet may be used without limitation as long as it can apply a known coating composition on a surface, and as a non-limiting example, the composition may be applied on the magnetic sheet by a method such as blade coating, flow coating, casting, printing, transferring, brushing, dipping, or spraying.

Meanwhile, as shown in FIG. 1, when the magnetic sheet 100 further includes the adhesive member 130, the adhesive member 130 may be attached, before the operation 1-1) is performed, to one surface of the magnetic sheet 100 on which the composition for forming a thin film coating layer is not applied. However, the timing at which the adhesive member 130 is attached is not necessarily limited to the aforementioned, and the adhesive member 130 may be attached between the operation 1-1) and the operation 1-2), which will be described below, or may be attached after an operation (2) of crushing.

Then, the operation 1-2) may be performed to solidify entirely or partially the composition for forming a thin film coating layer, which is applied on the magnetic sheet.

A selected solidification degree for the composition for forming a thin film coating layer may be varied according to a specific embodiment, and for example, in a method of manufacturing a magnetic sheet having a plurality of magnetic layers without using a separate adhesive layer for attaching the plurality of magnetic layers, a thin film coating layer may be maintained in a semi-solidified state so as to substitute the thin film coating layer with an adhesive layer. That is, since a completely solidified thin film coating layer has almost no tackiness for workability at room temperature and has no adhesiveness, it is impossible to attach the completely solidified thin film coating layer to another magnetic layer without an adhesive, but there is an advantage in that the semi-solidified thin film coating layer according to the composition may attach two independently manufactured magnetic layers to each other without a separate adhesive through complete solidification after the semi-solidified thin film coating layer is attached to the other magnetic layer. However, only a composition for forming a thin film coating layer, which is capable of having mechanical strength and a bending property which prevent the semi-solidified thin film coating layer from being tearing or damaged by magnetic pieces generated in the operation (2) of crushing, may preferably be implemented in a semi-solidified state.

A type of solidification (or curing) performed in the operation 1-2) may be determined according to a type of polymer included in the composition for forming a thin film coating layer and specific types of curable components which are further provided according to a type of selected polymer, and when solidification is realized by curing through a chemical reaction, e.g., solidification is realized by thermal curing, curing may be performed at a temperature in the range of 50 to 200° C. for 1 second to 10 minutes, and for specific curing, a known method may be employed and thus the present invention is not particularly limited thereto. As a non-limiting example, the composition for forming a thin film coating layer may be cured by passing through a separate heat source, and at this point, a constant pressure may additionally be applied to the composition, and as an example in which heat and a pressure can simultaneously be applied, a magnetic sheet on which the composition for forming a thin film coating layer is applied passes through a hot roller, which is heated at a desired temperature, such that the composition for forming a thin film coating layer may be cured.

Further, when the composition is photocured, photocuring may be performed under the action of actinic rays of preferable high-energy radiation, i.e., UV radiation or sunlight and preferably having wavelengths in the range of 200 nm to 750 nm. For example, a radiation source or a UV light source may include a medium or high pressure mercury vapor or the like, and the mercury vapor may be modified by injection with another element such as gallium or iron. A laser, a pulsed lamp (called a UV flash lamp), a halogen lamp or an excimer radiation means may also be used. The radiation means may be installed at a fixed position and the magnetic sheet, which will be irradiated, may be moved to pass through the radiation source by a mechanical device, and alternatively, the radiation means may be movable and the magnetic sheet, which will be irradiated, is not displaced during curing. Typically, in UV curing, a sufficient radiation dose is in the range of 80 mJ/cm$^2$ to 5000 mJ/cm$^2$ and a radiation intensity is in the range of 80 mW/cm$^2$ to 3000 mW/cm$^2$. For example, the radiation may also optionally be performed except for oxygen under an insoluble gas atmosphere or an oxygen-depleted atmosphere. Preferably, the suitable insoluble gas is nitrogen, carbon dioxide, an inert gas, or a combustion gas. Alternatively, the irradiation may be performed by coating a dry layer having a medium which transmits radiation.

Meanwhile, when the magnetic sheet 100 further include the protective member 140 on the thin film coating layer 110b without a separate adhesive, it is preferable that a protective member is disposed on the composition for forming a thin film coating layer between the operation 1-1) and the operation 1-2) and then the operation 1-2) of solidification or partial solidification is performed.

Next, the operation (2) according to one embodiment of the present invention of crushing the magnetic sheet having the thin film coating layer formed thereon may be performed.

A known method of crushing a magnetic body may be employed as the method of crushing the magnetic sheet without limitation. For example, a stacked structure in which an adhesive member, a magnetic sheet, a thin film coating layer, and a protective member are sequentially stacked in the order thereof may pass through a crushing device and thus the magnetic sheet may be broken into amorphous magnetic pieces, and thereafter, a pressure may be applied to planarize a magnetic layer and allow the thin film coating layer to firmly fix the magnetic pieces. Alternatively, without crushing the stacked structure after the stacked structure is manufactured, the stacked structure may be crushed in a state of having only the thin film coating layer without the protective member, and even when the stacked structure has the protective member when crushed, a temporary protective member such as paper without having an adhesive layer may be disposed on the magnetic sheet having the thin film coating layer formed thereon and then may be removed after the stacked structure is crushed.

Further, the applied pressure may be varied according to the purpose, and as an example, when a stacked structure includes a thin film coating layer in a semi-solidified state, the applied pressure may be adjusted to infiltrate a portion of the thin film coating layer into a space between the magnetic pieces and the number of times the pressure is applied may be increased. When the thin film coating layer infiltrates into the space between the magnetic pieces as described above, the thin film coating layer may firmly fix and support the magnetic pieces and at the same time, buffer the magnetic pieces, thereby preventing additional damage, crushing, and fine fragmentation of the magnetic pieces caused by an external force, such that degradation of physical properties and moisture infiltration may be blocked to prevent oxidation of the magnetic body.

The applying of the pressure to the stacked structure may be performed by applying a pressure to the stacked structure together with the crushing in the crushing device or may be further performed by a separate pressure applying process after the stacked structure is crushed.

Figure 5A:
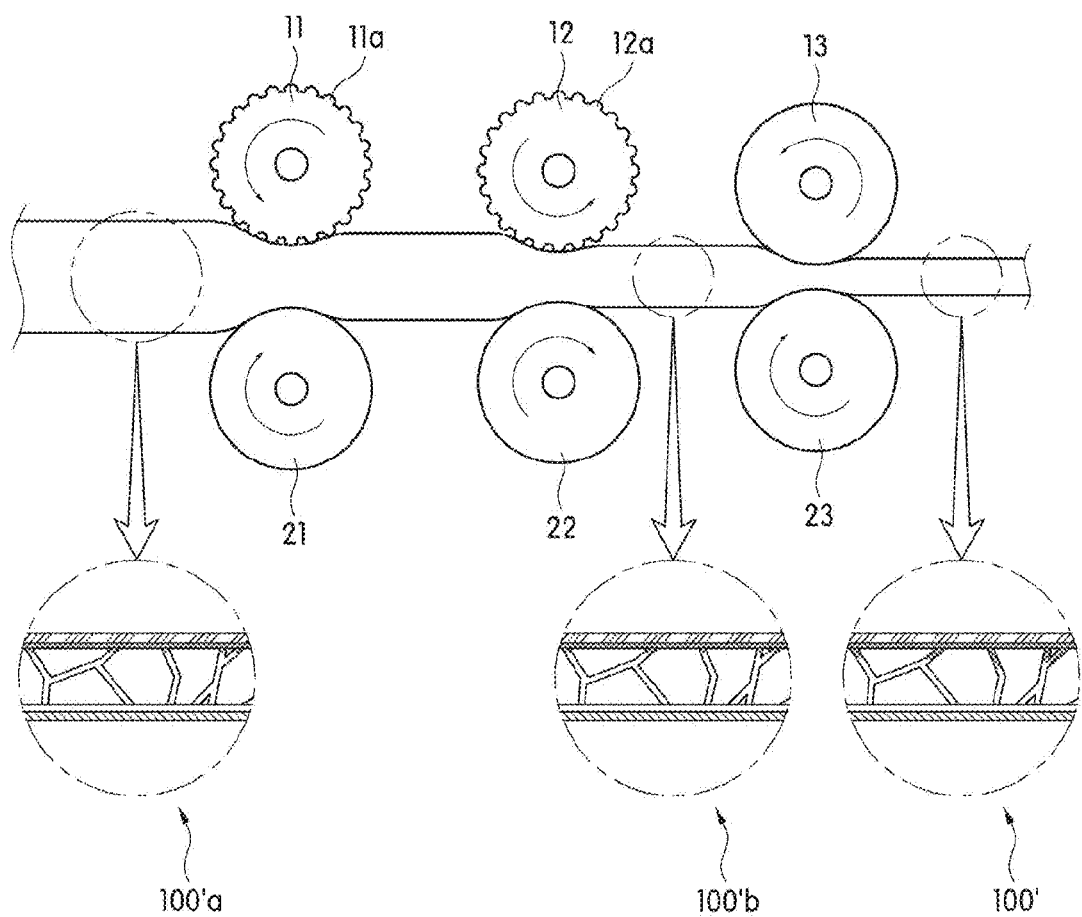
FIGS. 5A, 5B, and 6 are mimetic diagrams illustrating a manufacturing process performed through a crushing device used for manufacturing the magnetic sheet according to an embodiment of the present invention.

Specifically, as shown in FIG. 5A, the magnetic sheet 100' may be manufactured such that a stacked structure 100'a, in which a magnetic body made of an amorphous alloy is stacked, is crushed and pressurized by passing through a crushing device having a plurality of first rollers 11 and 12 with uneven portions 11a and 12a and second rollers 21 and 22 corresponding to the plurality of first rollers 11 and 12, and then a stacked structure 100'b is further pressurized by a third roller 13 and a fourth roller 23 corresponding to the third roller 13. At this point, infiltration of the thin film coating layer into the space between the crushed magnetic pieces may be controlled according to a degree of pressurization.

Figure 5B:
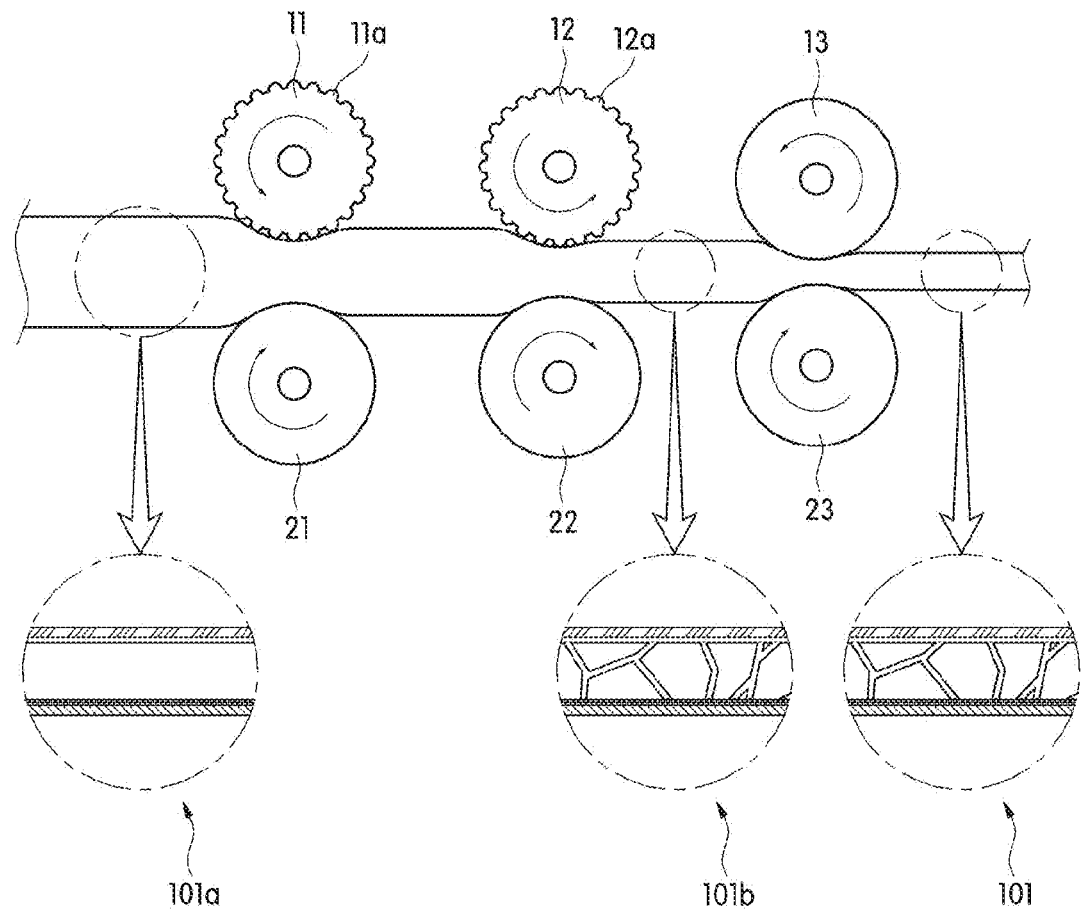

Alternatively, as shown in FIG. 5B, a magnetic sheet 101 may be manufactured such that a stacked structure 101a including a ferrite magnetic body is crushed and pressurized by passing through the same crushing device, and then a stacked structure 101b is further pressurized by the third roller 13 and the fourth roller 23 corresponding to the third roller 13, thereby allowing the magnetic sheet 101 to have an appropriate particle size distribution. At this point, it may be important to control the degree of pressurization such that the space between the crushed magnetic pieces is minimized and the thin film coating layer is prevented from infiltrating into the space.

Figure 6:
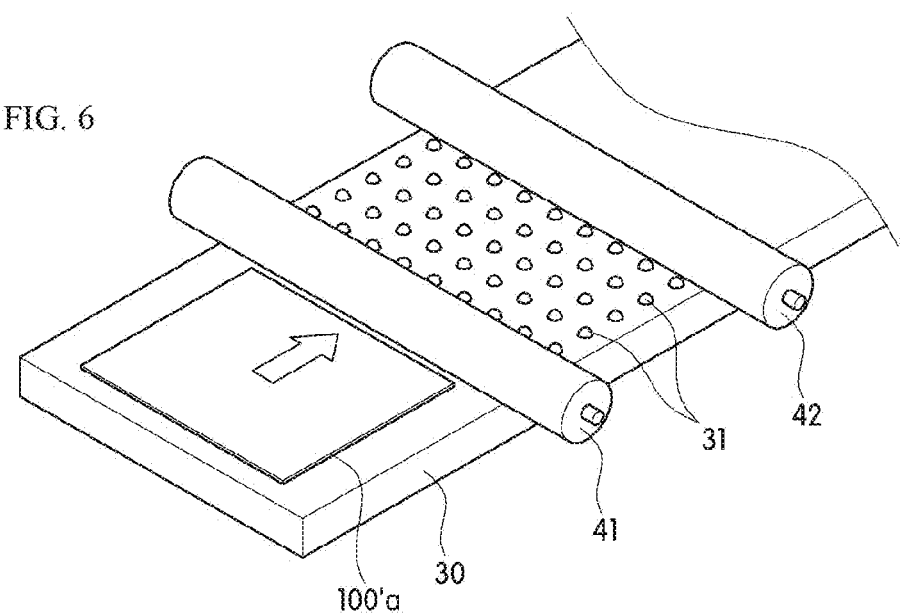

Alternatively, as shown in FIG. 6, the stacked structure 100'a including a magnetic sheet is put into a crushing device which is provided with a support plate 30 having a plurality of metal balls 31 mounted on one surface thereof and rollers 41 and 42 disposed on the support plate 30 and configured to move a target object which will be crushed, and a pressure is applied to the stacked structure 100'a through the plurality of metal balls 31, such that the magnetic sheet may be crushed. Each of the plurality of metal balls 31 may be in a spherical shape but is not limited thereto, and a shape of each of the plurality of metal balls 31 may be a triangle, a polygon, an ellipse, or the like, and a shape of a ball provided at each roller may be one shape or a mixture of various shapes.

Next, a magnetic sheet may be manufactured by the second manufacturing method according to the present invention including an operation (1') of crushing a magnetic body and manufacturing a magnetic layer formed of magnetic pieces, and an operation (2') of forming a thin film coating layer on the magnetic layer. At this point, the operations (1') and (2') are the same as the operations (2) and (1) of the above-described first manufacturing method, and thus overlapping descriptions will be omitted.

In the second manufacturing method, a temporary protective member may further be provided on one side of the magnetic layer in the operation (1') to pass through the crushing device. The temporary protective member has advantages of preventing scattering and a loss of the crushed magnetic body to make a comfortable workplace environment and preventing an increase in material cost due to the loss of the magnetic body. Further, the temporary protective member may have an adhesive layer on one surface thereof to be temporarily adhered to the magnetic body or may be physically placed on the magnetic body without being temporarily adhered to the magnetic body and may pass through the crushing device. The temporary protective member may be a conventional PET film or paper, and there is no particular limitation on a material.

At this point, the above-described first manufacturing method is easily implemented to prevent the infiltration of the thin film coating layer into the space between the magnetic pieces rather than the second manufacturing method, so that the first manufacturing method may be more suitable for an embodiment in which a magnetic layer is formed of magnetic pieces of a magnetic body such as ferrite having high specific resistance and a magnetic property which is prone to deteriorating when the thin film coating layer infiltrates into the space between the magnetic pieces. More specifically, the first manufacturing method may be suitable for a case in which a magnetic sheet is provided with a magnetic body including at least one selected from the group consisting of Mn—Zn-based ferrite, Ni—Zn-based ferrite, Ni—Co-based ferrite, Mg—Zn-based ferrite, Cu—Zn-based ferrite, and cobalt-substituted Y or Z hexagonal ferrite.

Further, the second manufacturing method is more advantageous to implement the thin film coating layers $110b'$ or $110b''$ to partially or entirely infiltrate into the space between the magnetic pieces rather than the first manufacturing method, so that the second manufacturing method is more suitable for an embodiment in which a magnetic layer is formed of a magnetic body in which a magnetic loss may be caused by an eddy current due to low electrical resistance (e.g., a magnetic body such as a Fe—Si—B-based amorphous alloy).

Figure 7:
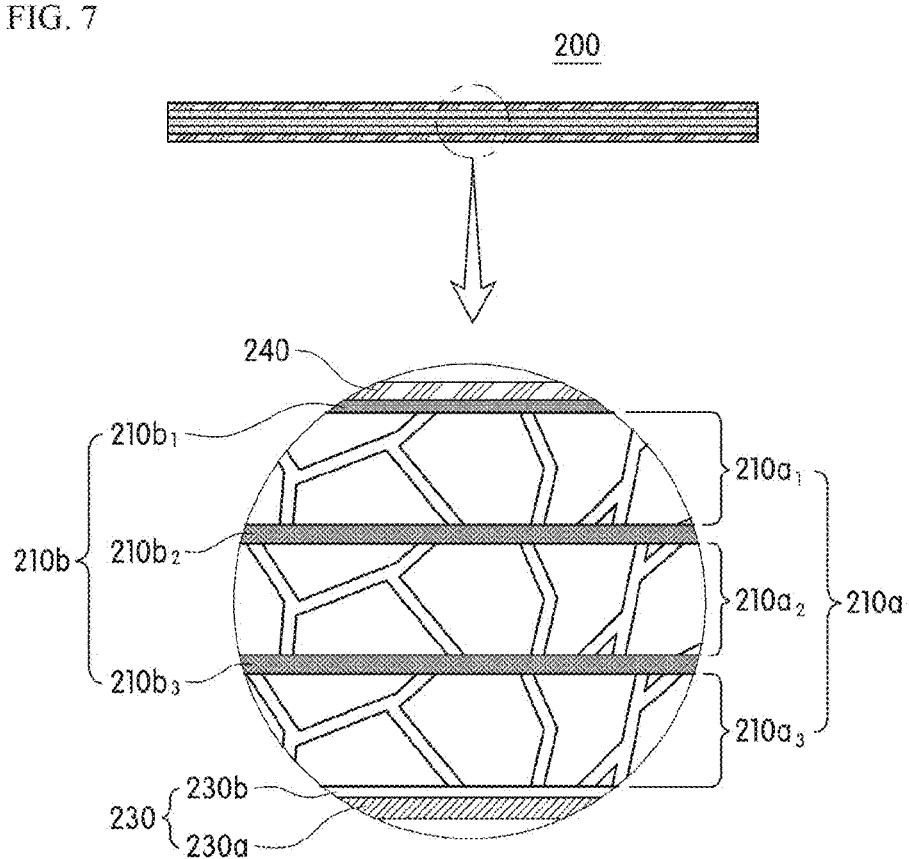
FIG. 7 is a cross-sectional view of a magnetic sheet having three magnetic layers formed of magnetic pieces according to an embodiment of the present invention.

Meanwhile, as shown in FIG. 7, a magnetic sheet 200 according to another embodiment of the present invention may include a plurality of magnetic layers $210a_1$, $210a_2$, and $210a_3$, and thin film coating layers $210b_2$ and $210b_3$ may be stacked between the adjacent magnetic layers $210a_1$ and $210a_2$ and the adjacent magnetic layers $210a_2$ and $210a_3$. Alternatively, in some cases unlike that shown in FIG. 7, a portion of the second thin film coating layer $210b_2$ may infiltrate into a lower portion of a space between magnetic pieces forming the first magnetic layer $210a_1$ and an upper portion of a space between magnetic pieces forming the second magnetic layer $210a_2$, and a portion of the third thin film coating layer $210b_3$ may infiltrate into a lower portion of a space between magnetic pieces forming the second magnetic layer $210a_2$ and an upper portion of a space between magnetic pieces forming the third magnetic layer $210a_3$, such that effects of supporting the magnetic pieces, fixing the magnetic pieces, preventing additional damage, crushing, and fine fragmentation of the magnetic pieces due to an external force, and blocking moisture infiltration may be further improved.

The magnetic sheet of FIG. 1 having only the single magnetic layer may be limited in some cases to exhibit a physical property suitable for some applications. That is, in order to improve the magnetic properties of the magnetic sheet, a magnetic body having a superior magnetic property such as magnetic permeability may be selected, or in the case of a magnetic body having relatively low magnetic permeability, a magnetic layer may be implemented to prevent easy magnetic saturation thereof by increasing a thickness of the magnetic layer. However, in order to increase the thickness of the magnetic layer, a thickness of a single-layered magnetic sheet in which the magnetic layer is formed should be increased to a predetermined level or more. However, it is difficult to manufacture a ribbon sheet of a Fe-based amorphous alloy having a thick thickness due to process limitations, and since a surface and an interior of the ribbon sheet are not uniformly and evenly calcined during calcination, calcined particle structures of the surface and the interior may be different from each other such that improvement in magnetic permeability may be insignificant. Further, when a thickness of the ferrite is thick, crystal structures and sizes of a surface and an interior of the ferrite may not be uniform in calcination. Accordingly, a plurality of magnetic layers are provided to increase an overall thickness of a magnetic layer in a magnetic sheet such that a magnetic saturation capacity of the magnetic layer may increase, and the magnetic sheet having the stacked magnetic layers further improves an antenna characteristic for a desired application such that signal transmission and reception efficiencies and distances may be significantly improved.

When the plurality of magnetic layers are provided in the magnetic sheet, the number of magnetic layers is preferably 2 to 12, and more preferably 3 to 10. When the number of stacked magnetic layers exceeds 12, improvement in antenna a characteristic for a desired application may be insignificant, and when the number of stacked magnetic layers is less than 2, an improvement range in antenna a characteristic for a desired application may be insignificant in comparison with a single magnetic layer such that the antenna characteristic may not be improved to a desired level.

Further, a protective member 240 included in one embodiment of the present invention may be attached to a first thin film coating layer $210b_1$ without a separate adhesive, and alternatively, unlike shown in FIG. 7, the protective member 240 may be attached on the first thin film coating layer $210b_1$ through a separate adhesive layer (not shown) or on the first magnetic layer $210a_1$ by omitting the first thin film coating layer $210b_1$.

Furthermore, as shown in FIG. 7, an adhesive member 230 may be provided below the third magnetic layer $210a_3$ to be attached on a target surface to which the magnetic sheet will be attached. At this point, the adhesive member 230 may be attached to a lower portion of the third magnetic layer $210a_3$ through a separate adhesive layer (not shown). Alternatively, unlike shown in FIG. 7, when a thin film coating layer is provided on a lower surface of a magnetic layer disposed at a lowermost portion, e.g., when a fourth thin film coating layer (not shown) is formed on a lower surface of the third magnetic layer $210a_3$, the adhesive member 230 may be attached to a lower portion of the fourth thin film coating layer (not shown) through an adhesive layer (not shown) or may be directly attached to the lower portion thereof without the adhesive layer.

A manufacturing method of the magnetic sheet of FIG. 7 having the plurality of magnetic layers is specifically similar to the above-described manufacturing method of the magnetic sheet having the single magnetic layer, and as one example, the magnetic sheet of FIG. 7 may be manufactured by the manufacturing method including manufacturing a stacked structure having a plurality of magnetic layers by interposing a thin film coating layer between adjacent magnetic layers, and crushing the stacked structure, and specifically, the magnetic sheet of FIG. 7 may be manufactured by the manufacturing method including manufacturing the stacked structure by alternately stacking a magnetic layer and a composition for forming a thin film coating layer in a manner of applying the composition for forming a thin film coating layer on a first magnetic layer and disposing a second magnetic layer on the composition for forming a thin film coating layer and curing the stacked magnetic layers and compositions, and crushing the stacked structure.

Alternatively, the magnetic sheet having a plurality of magnetic layers may be manufactured by preparing the plurality of magnetic layers, each of which has a semi-cured thin film coating layer on one surface thereof, formed of magnetic pieces, stacking the plurality of magnetic layers to interpose the semi-cured thin film coating layers between the plurality of magnetic layers, and completely solidifying the semi-cured thin film coating layers.

Alternatively, the magnetic sheet having a plurality of magnetic layers may be manufactured by preparing the plurality of magnetic layers, each of which has a semi-solidified thin film coating layer on one surface thereof, stacking the plurality of magnetic layers to interpose the semi-solidified thin film coating layers between the plurality of magnetic layers to thereby manufacture a stacked structure, and completely solidifying the semi-solidified thin film coating layers to crush the stacked structure or crushing the stacked structure to completely solidify the semi-solidified thin film coating layers.

Meanwhile, compositions, fine structures, and/or physical properties of magnetic bodies included in the plurality of magnetic layers $210a_1$, $210a_2$, and $210a_3$ may be the same or be different from each other. Further, it may be configured such that thicknesses of the plurality of magnetic layers may be the same, may be partially different from each other, or may be entirely different therefrom according to the purpose, and thus the thicknesses are not particularly limited in the present invention.

Furthermore, each of the magnetic sheets 100, 100', 100", and 200 of the various embodiments of the present invention may include at least one functional layer (not shown) for blocking electromagnetic waves and/or for dissipating heat on at least one surface of each of the magnetic sheets 100, 100', 100", and 200. The magnetic sheet having the functional layer may prevent a significant increase in frequency variation of an antenna combined with the magnetic sheet due to electromagnetic waves such as power supply noise to thereby reduce a defect rate of the antenna, and when a portable device to which the magnetic sheet is applied generates heat, the magnetic sheet may easily dissipate the heat to prevent degradation in durability of parts and in functions caused by heat generation and user discomfort caused by heat transfer.

Further, when the functional layer provided at a top and/or a bottom of the magnetic sheet is a functional layer having a heat dissipation function, transversal thermal conductivity of the magnetic sheet may be improved.

Specifically, a functional layer such as an electromagnetic wave blocking layer, a heat dissipation layer, and/or a composite layer in which the electromagnetic wave blocking layer and the heat dissipation layer are stacked or in which the electromagnetic wave blocking layer and the heat dissipation layer are combined as a single layer may be provided at a top of the protective member 140 and/or a bottom of the adhesive member 130 of the magnetic sheet 100. For example, a metal foil such as copper, aluminum, or the like, which has superior thermal conductivity and superior electrical conductivity, may be attached to the top of the protective member 140 through an adhesive or a double-sided tape. Alternatively, Cu, Ni, Ag, Al, Au, Sn, Zn, Mn, Mg, Cr, Tw, Ti, or a combination thereof may be deposited on the protective member 140 by a known method such as sputtering, vacuum deposition, chemical vapor deposition, or the like to thereby form a metal thin film. When the functional layer is provided through an adhesive, the adhesive may be a known adhesive, and as a non-limiting example, an acrylic-based adhesive, a urethane-based adhesive, an epoxy-based adhesive, and the like may be used. Meanwhile, the adhesive may have heat radiation performance, and to this end, a known filler such as nickel, silver, a carbon material, or the like may be mixed with the adhesive, and the content of the filler may be a content of a filler in a known heat dissipation adhesive and thus the content of the filler is not particularly limited in the present invention.

A thickness of the functional layer may be in the range of 5 to 100 μm, and more preferably in the range of 10 to 20 μm in order to reduce the thickness of the magnetic sheet.

As described above, the magnetic sheet 100, 100', 100", or 200 according to one embodiment of the present invention may be implemented as a composite magnetic unit which is combined with another magnetic sheet having a different magnetic property at a predetermined frequency and is capable of simultaneously improving characteristics of antennas using different frequency bands, and at this point, the magnetic sheet 100, 100', 100", or 200 and the other magnetic sheet may be disposed in a stacked structure or the magnetic sheet 100, 100', 100", or 200 may be disposed and inserted into the other magnetic sheet, and thus a specific arrangement relationship is not limited in the present invention.

Meanwhile, the magnetic sheet may be used for the purpose of blocking a magnetic field at a specific frequency, and the same magnetic sheet may be used for the purpose of absorbing electromagnetic waves in other specific frequency bands.

Figure 8A:
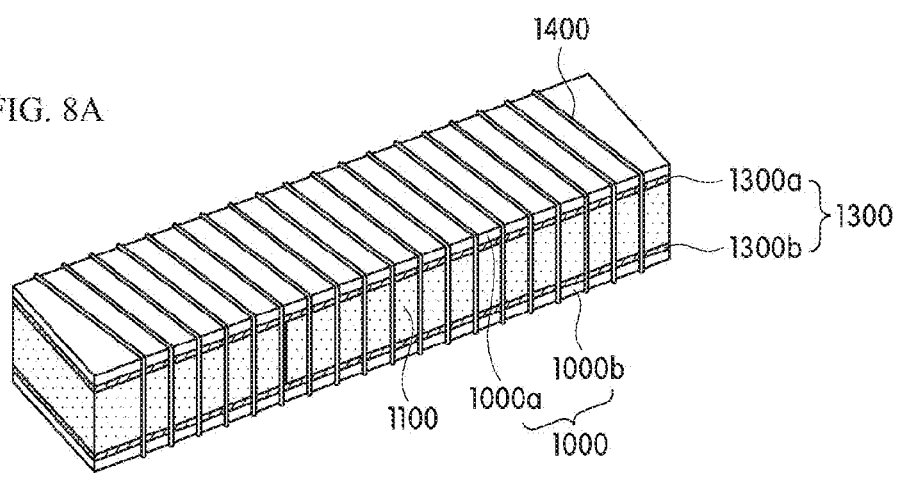

Further, the above-described magnetic sheet 100, 100', 100", or 200 according to one embodiment of the present invention may be attached on at least one surface of an antenna core as a magnetic field unit 1000 including at least one magnetic sheet and may be implemented as a low-frequency antenna, and as shown in FIG. 8A, the low-frequency antenna includes an antenna core 1100, the magnetic field unit 1000 attached to both sides of the antenna core 1100, and a coil 1400 wound on an outer surface of each of the antenna core 1100 and the magnetic field unit 1000. At this point, the antenna core 1100 may be a magnetic body, e.g., Ni—Zn-based ferrite and may have a long bar shape, and the long bar shaped antenna core may be easily segmented into lumps due to high brittleness of ferrite, so that there is problem in that an initially designed physical property such as magnetic permeability may not be satisfied. However, even when degradation in a physical property is caused by segmentation of the antenna core, the magnetic field unit attached to at least one surface of the antenna core has an advantage of continuously exhibiting a function as the low-frequency antenna through complementation of the physical property, and since the magnetic sheet provided in the magnetic field is superior in terms of flexibility and buffering, additional fine fragmentation of magnetic pieces provided in the magnetic sheet is prevented even when an external force is applied, such that complementation of the magnetic property of the antenna core may be sustained through the magnetic field unit for a long period of time.

Further, the above-described magnetic sheet according to one embodiment of the present invention may be used as a core for implementing a low-frequency antenna, and as shown in FIG. 8B, the low-frequency antenna may be implemented by including a magnetic layer 1010a configured with three layers, a thin film coating layer 1010b interposed between the three layers of the magnetic layer 1010a, a core portion formed of a magnetic sheet 1000' implemented with protective members 1041 and 1042 on both sides of the magnetic layer 1010a, and a coil 1400' wound on an outer surface of the core portion, and the low-frequency antenna shown in FIG. 8B may be more advantageous for exhibiting a very superior characteristic in a low-frequency region including an operating frequency of 22 kHz.

Furthermore, the above-described magnetic sheet 100, 100', 100", or 200 according to one embodiment of the present invention may be implemented as a WPT module by being combined with an antenna for WPT as the magnetic field unit 1000 including at least one magnetic sheet. To describe the aforementioned with reference to FIG. 9, the magnetic field unit 1000 may be disposed on one surface of an antenna unit 1500 including an antenna 1530 for WPT formed on a circuit board 1510 to improve a characteristic of the antenna 1530 for WPT and focus a magnetic flux toward the antenna 1530 for WPT. At this point, the magnetic field unit 1000 may be attached to the antenna unit 1500 through an adhesive member, which may be provided on one surface of the magnetic sheet, or through a separate adhesive member (not shown).

The antenna unit included in one embodiment of the present invention may further include one or more of an antenna for NFC and an antenna for magnetic secure transmission (MST). As shown in FIG. 9, an antenna 1540 for MST may be disposed outside the antenna 1530 for WPT and an antenna 1550 for NFC may be disposed outside the antenna 1540 for MST to form the antenna unit 1500.

Figure 10:
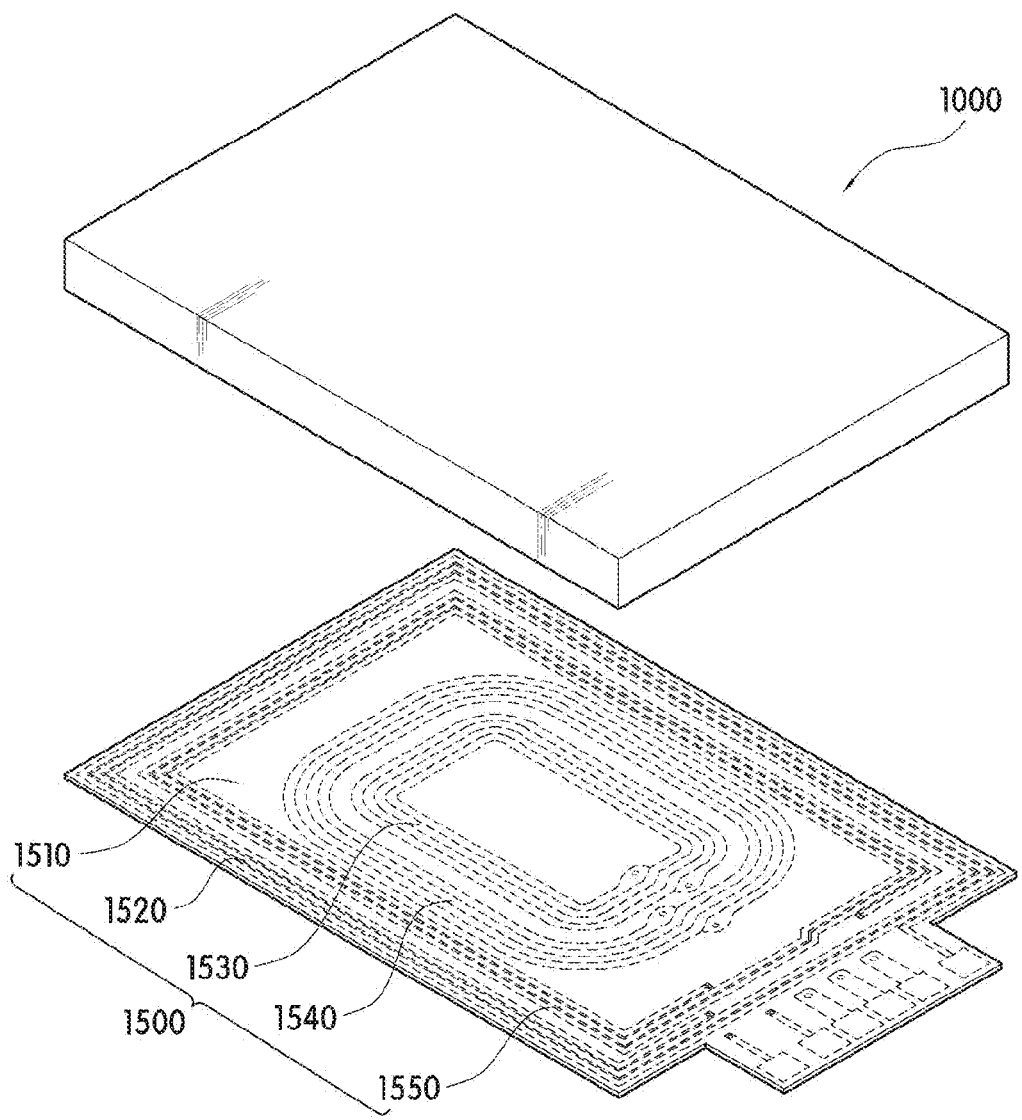

Further, the antenna for WPT provided in the antenna unit included in one embodiment of the present invention may include one or more of a magnetic resonance type antenna for WPT having an operating frequency in a frequency band including a frequency of 6.78 MHz and a magnetic induction type antenna for WPT having an operating frequency in a frequency band including a frequency of 100 kHz. To describe the aforementioned with reference to FIG. 10, the antenna unit 1500 may include a magnetic induction type antenna 1530 for WPT disposed at an innermost side of the antenna unit 1500 and having an operating frequency in a frequency band including a frequency of 100 kHz and a magnetic resonance type antenna 1520 for WPT disposed at an outermost side of the antenna unit 1500 and having an operating frequency in a frequency band including a frequency of 6.78 MHz.

Figure 11:
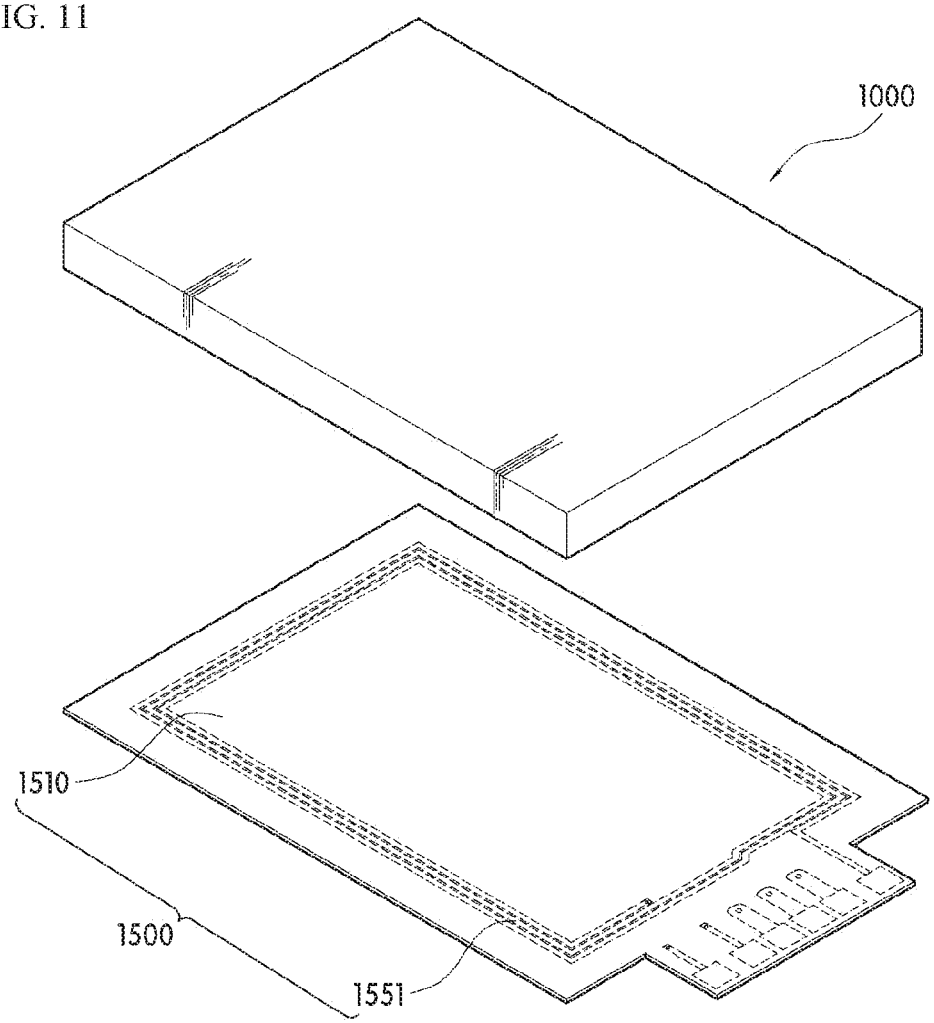
FIG. 11 is an exploded perspective view of a near-field communication module according to an embodiment of the present invention.

Further, the above-described magnetic sheet 100, 100', 100", or 200 according to one embodiment of the present invention may be implemented as an NFC module by being combined with an antenna for NFC as the magnetic field unit 1000 including at least one magnetic sheet. To describe the aforementioned with reference to FIG. 11, the magnetic field unit 1000 may be disposed on the antenna unit 1500 including an antenna 1551 for NFC formed on the circuit board 1510 to improve a characteristic of the antenna 1551 for NFC and focus a magnetic flux toward the antenna 1551 for NFC.

Meanwhile, the above-described WPT module or the above-described NFC module according to the present invention may be a transmission module for transmitting a radio signal to an electronic device or a reception module for receiving a radio signal from the transmission module. Further, each of the antennas 1520, 1530, 1540, 1550, and 1551 provided in the antenna unit 1500 included in the WPT module or the NFC module may be an antenna coil in which a coil is wound to have a predetermined inner diameter or an antenna pattern which is printed on a substrate, and a specific shape, structure, size, and material of the antenna are not particularly limited in the present invention.

Furthermore, the above-described NFC module and/or the above-described wireless charging module according to one embodiment of the present invention may be provided in a portable device as an NFC reception module for receiving transmitted data or a wireless power reception module for receiving transmitted wireless power and data, and thus WPT efficiency, data reception efficiency, and a charging distance or a data reception distance may be significantly improved.

Hereinafter, preferred examples will be described in order to facilitate understanding of the present invention. It should be noted, however, that the following preferred examples are only for helping to understand the present invention, and the present invention is not limited by the following experimental examples.

Example 1. Manufacturing of Magnetic Sheet

A $Fe_{91.6}Si_2B_6CO_{0.2}Ni_{0.2}$ amorphous alloy ribbon was manufactured by rapid solidification (RSP) using melt spinning, a ribbon sheet cut into a sheet shape and having a thickness of 24 μm was subjected to non-magnetic field heat treatment at a temperature of 460° C. for 1 hour under an air atmosphere, and thus the ribbon sheet having a magnetic body was manufactured.

Figure 12:
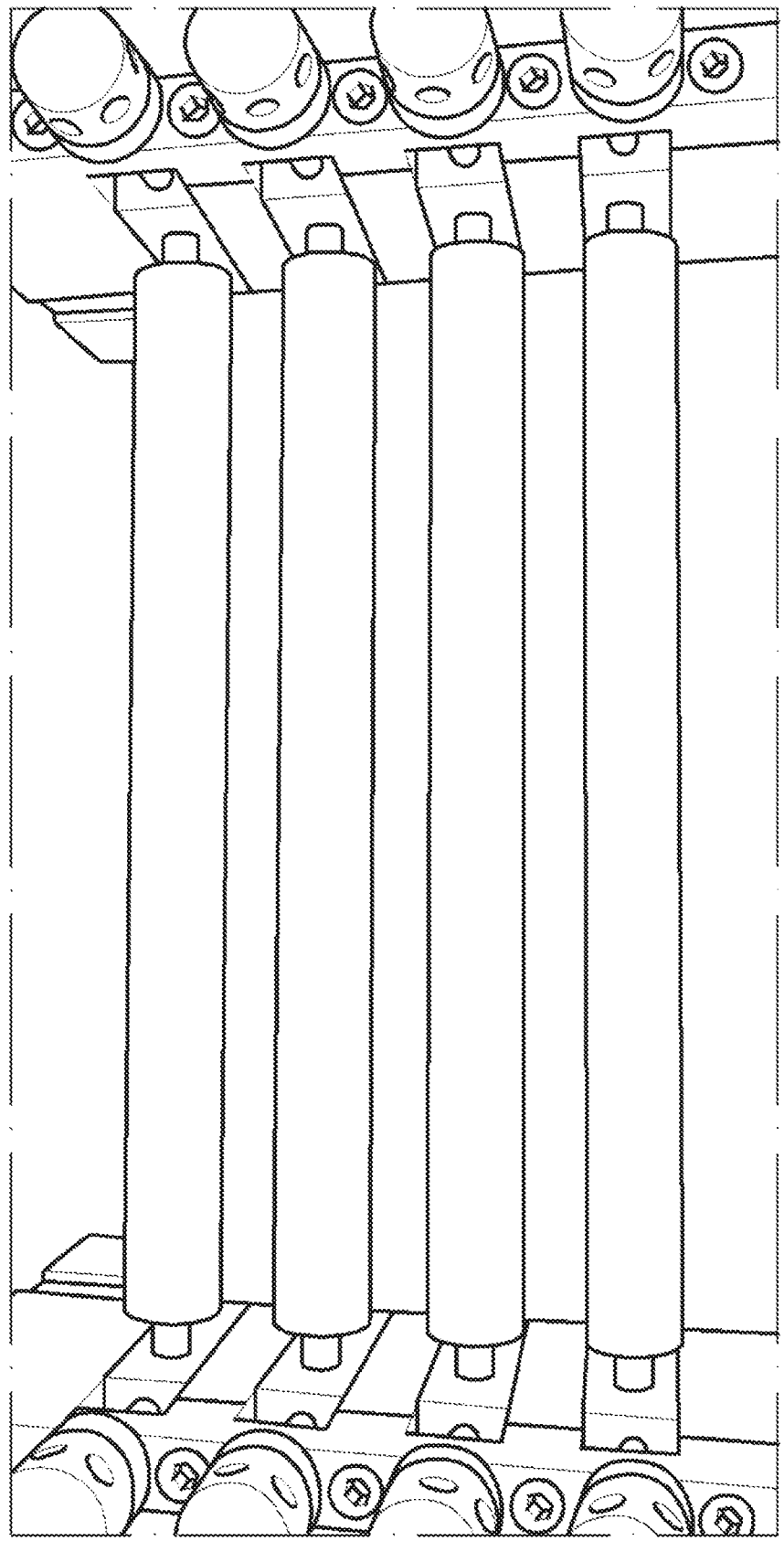
FIG. 12 is a photograph of the crushing device according to FIG. 6 when viewed from above.

Then, 9 wt % EPDM and 91 wt % toluene were mixed to manufacture a liquid composition for forming a thin film coating layer, and the liquid composition was applied on the ribbon sheet using a bar coater (RDS #22) and dried at a temperature of 100° C. for 1 minute to form a thin film coating layer having a thickness of 3 μm. Subsequently, two ribbon sheets were stacked by roll pressing under the conditions of a temperature of 130° C. and 10 kg/cm² to manufacture a stacked structure. Thereafter, the stacked structure passed three times through the crushing device as shown in FIG. 6 or 12 to manufacture a magnetic sheet in which the magnetic body provided in the magnetic sheet was crushed into amorphous magnetic pieces.

Examples 2 to 8

A magnetic sheet was manufactured as the same as in Example 1 except for changing the liquid composition for forming a thin film coating layer as shown in the following Table 1.

Comparative Example 1

A magnetic sheet was manufactured as the same as in Example 1 except for interposing a double-sided tape having a thickness of 10 μm (a support base material is PET, that is, VT-8210C, supplied by K-WON Corporation) between the two ribbon sheets and attaching the two ribbon sheets to each other instead of forming the thin film coating layer to stack the two ribbon sheets by roll pressing.

TABLE 1

| | Binder | | Solvent | |
|---|---|---|---|---|
| Items | Type | wt % | Type | wt % |
| Example 1 | EPDM | 9 | toluene | 91 |
| Example 2 | Chlorinated Polyethylene (CPE) | 10 | toluene | 90 |
| Example 3 | Acrylic Rubber | 18 | toluene | 82 |
| Example 4 | polyethylene | 14 | methyl ethyl ketone (MEK) | 86 |
| Example 5 | ethylene-vinyl acetate copolymer (EVA) | 14 | water | 86 |
| Example 6 | Epoxy (Bisphenol-A) | 30 | MEK | 70 |
| Example 7 | Epoxy (CTBN rubber degeneration) | 18 | toluene/MEK | 82 |

TABLE 1-continued

| | Binder | | Solvent | |
|---|---|---|---|---|
| Items | Type | wt % | Type | wt % |
| Example 8 | polyurethane (PU) | 17 | toluene/MEK | 83 |
| Comparative Example 1 | polyethylene terephthalate (PET) double-sided tape | | | |

Experimental Example 1

Adhesive strengths for the stacked structures prepared in the manufacturing of the magnetic sheets according to the examples and comparative example were evaluated. Specifically, in order to evaluate adhesive strength of the thin film coating layer between the two stacked ribbon sheets, the magnetic sheet formed of the two stacked ribbon sheets including the magnetic pieces was manually separated, and at this point, a degree of breakage of the magnetic sheet was evaluated, and as shown in the following Table 2, a very good case is indicated by ⊚, a good case is indicated by O, a bad case is indicated by Δ, and a very bad case is indicated by ×.

Experimental Example 2

The following physical properties for the magnetic sheets manufactured according to Examples and Comparative Example were evaluated and shown in Table 2.

1. Evaluation for Stretching Force

To measure a stretching force of the magnetic body provided in the magnetic sheet, a 3 cm×3 cm sample of the magnetic sheet was obtained, a 20 kg/cm² tensile force was applied to both ends of the magnetic sheet sample for 10 seconds, and a degree of breakage of the magnetic sheet sample was evaluated and shown as a numerical value in the range of 1 to 100 on the basis of the magnetic sheet manufactured according to Example 1. (The stretching force is superior as the numerical value increases)

2. Evaluation for Degree of Delamination Prevention of Magnetic Piece

To measure delamination prevention of the magnetic piece contained in the magnetic sheet, a 3 cm×3 cm sample of the magnetic sheet was obtained, a 20 kg/cm² tensile force was applied to both ends of the magnetic sheet sample for 10 seconds, the degree of delamination prevention of the magnetic piece on a surface of the magnetic sheet sample was visually determined and evaluated, and a very good case in which there is no delamination of the magnetic pieces is indicated by ⊚, a good case is indicated by o, a bad case is indicated by Δ, and a very bad case is indicated by ×.

3. Evaluation for Tack at Room Temperature

A 3 cm×3 cm sample of the magnetic sheet was obtained and tack was measured using a probe tack measuring instrument, and at this point, a diameter of a probe was 5 mm and the tack was measured under the conditions in which a load of 200 gf was applied to the magnetic sheet sample for 10 seconds and the magnetic sheet sample was pulled at 10 mm/sec.

At this point, when the measured tack of each of upper and lower surfaces of the magnetic sheet sample was 10 gf or more, the tack was determined as being excessive and indicated by o, and when the measured tack was 10 gf or less, the tack was determined as being normal and indicated by ×.

TABLE 2

| Items | Adhesive Strength | Stretching Force | Delamination Prevention of Magnetic Piece | Tack |
|---|---|---|---|---|
| Example 1 | O | 100 | ⊚ | X |
| Example 2 | O | 85 | Δ | X |
| Example 3 | O | 94 | ⊚ | X |
| Example 4 | ⊚ | 76 | ⊚ | X |
| Example 5 | O | 78 | Δ | O |
| Example 6 | ⊚ | 74 | ⊚ | O |
| Example 7 | ⊚ | 86 | ⊚ | O |
| Example 8 | O | 79 | O | O |
| Comparative Example 1 | Δ | 62 | (no magnetic body) | O |

Referring to Tables 1 and 2, it can be seen that the magnetic sheets of Examples 1 to 8, which were manufactured by including the thin film coating layer and the magnetic layer formed of the crushed magnetic pieces according to one embodiment of the present invention, generally exhibited superior characteristics in physical properties regarding adhesive strength, stretching force, and tack in comparison with a magnetic sheet using a conventional PET double-sided tape.

Specifically, in the case of the magnetic sheet including the thin film coating layer manufactured by containing 9 wt % EPDM as in Example 1, the adhesive strength was the same as those of other examples, but all the stretching force, the degree of delamination prevention of the magnetic pieces, and the tack were superior Further, Examples 2 and 3 in which the thin film coating layers were formed of chlorinated polyethylene (CPE), which is a rubber-based material different from that in Example 1, and acrylic rubber were slightly lower than Example 1 in terms of the degree of delamination prevention of the magnetic pieces but Examples 2 and 3 exhibited superior characteristics as a whole.

Furthermore, it can be seen that Examples 4 to 8 in which the thin film coating layers were formed of other materials instead of the rubber-based material, exhibited physical properties somewhat lower than those of Examples 1 to 3 using the rubber-based material, but in terms of all the physical properties, Examples 4 to 8 exhibited relatively superior characteristics in comparison with Comparative Example 1.

Although the present invention has been described in detail with reference to the preferred embodiments and the experimental examples, the present invention is not limited to the above-described preferred embodiments and the above-described experimental examples, and various modifications and alternations can be devised by those skilled in the art without departing from the technical spirit and scope of the present invention.

The invention claimed is:

1. A magnetic sheet comprising:
a magnetic layer formed of crushed pieces of a magnetic body to improve flexibility of the magnetic sheet; and
a thin film coating layer formed on at least one surface of the magnetic layer to maintain the magnetic layer in a sheet shape and buffer an external force applied to the crushed pieces of the magnetic body, wherein the thin film coating layer has a thickness of 10 μm or less and is a single layer formed of ethylene propylene diene monomer (EPDM) rubber.

2. The magnetic sheet of claim 1, wherein the thin film coating layer partially or completely infiltrates into a space between at least some adjacent pieces of the magnetic body.

3. The magnetic sheet of claim 1, wherein a single layer of the magnetic layer has a thickness in a range of 1 to 30 µm.

4. The magnetic sheet of claim 1, wherein:
the magnetic sheet includes a magnetic body made of a soft magnetic material; and
the soft magnetic material includes a metallic soft magnetic material or ferrite.

5. The magnetic sheet of claim 4, wherein:
the metallic soft magnetic material includes one or more selected from the group consisting of a Ni—Co-based alloy, a Fe—Ni-based alloy, a Fe—Cr-based alloy, a Fe—Al-based alloy, a Fe—Si-based alloy, a Fe—Si—B-based alloy, and a Fe—Si—B—Cu—Nb-based alloy; and
the ferrite includes one or more selected from the group consisting of Mn—Zn-based ferrite, Ni—Zn-based ferrite, Ni—Co-based ferrite, Mg—Zn-based ferrite, Cu—Zn-based ferrite, and cobalt-substituted Y or Z hexagonal-based ferrite.

6. A low-frequency antenna comprising:
an antenna core;
a magnetic sheet including
a magnetic layer formed of crushed pieces of a magnetic body to improve flexibility of the magnetic sheet, and
a thin film coating layer formed on at least one surface of the magnetic layer to maintain the magnetic layer in a sheet shape and buffer an external force applied to the crushed pieces of the magnetic body, the thin film coating layer having a thickness of 10 µm or less and being a single layer formed of ethylene propylene diene monomer (EPDM) rubber, the magnetic sheet being attached to one surface or both surfaces of the antenna core; and
a coil wound on an outer surface of each of the antenna core and the magnetic sheet.

7. A wireless power transmission (WPT) module comprising:
an antenna unit including an antenna for WPT; and
a magnetic field unit having at least one magnetic sheet including
a magnetic layer formed of crushed pieces of a magnetic body to improve flexibility of the magnetic sheet, and
a thin film coating layer formed on at least one surface of the magnetic layer to maintain the magnetic layer in a sheet shape and buffer an external force applied to the crushed pieces of the magnetic body, the thin film coating layer having a thickness of 10 µm or less and being a single layer formed of ethylene propylene diene monomer (EPDM) rubber, the at least one magnetic sheet being disposed on one surface of the antenna unit and configured to improve a characteristic of the antenna for WPT and focus a magnetic flux toward the antenna for WPT.

8. The WPT module of claim 7, wherein the antenna unit further includes at least one of an antenna for near-field communication (NFC) and an antenna for magnetic secure transmission (MST).

* * * * *